(12) United States Patent
Kim et al.

(10) Patent No.: US 12,046,070 B2
(45) Date of Patent: Jul. 23, 2024

(54) DISPLAY DEVICE

(71) Applicant: Samsung Display Co., Ltd., Yongin-si (KR)

(72) Inventors: Sangwoo Kim, Seoul (KR); Taekyung Ahn, Yongin-si (KR); Byung Han Yoo, Suwon-si (KR); Taehoon Yang, Yongin-si (KR); Dae-Young Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/307,787

(22) Filed: May 4, 2021

(65) Prior Publication Data

US 2022/0028934 A1 Jan. 27, 2022

(30) Foreign Application Priority Data

Jul. 23, 2020 (KR) .................. 10-2020-0091543

(51) Int. Cl.
*G06V 40/13* (2022.01)
*H10K 59/35* (2023.01)
*H10K 59/65* (2023.01)

(52) U.S. Cl.
CPC ....... *G06V 40/1318* (2022.01); *H10K 59/353* (2023.02); *H10K 59/65* (2023.02)

(58) Field of Classification Search
CPC .............................................. G09G 2300/0452
See application file for complete search history.

(56) References Cited

U.S. PATENT DOCUMENTS

| | | | |
|---|---|---|---|
| 8,913,093 B2* | 12/2014 | Shin ................... | G02F 1/133514 345/87 |
| 8,963,814 B2* | 2/2015 | Kim ...................... | G09G 3/3233 345/207 |
| 9,057,644 B2 | 6/2015 | Park | |
| 9,570,002 B2* | 2/2017 | Sakariya ................. | G06F 3/042 |
| 10,388,706 B2 | 8/2019 | Lee et al. | |
| 10,727,285 B2* | 7/2020 | Chung ................... | H10K 39/00 |
| 10,733,931 B2* | 8/2020 | Jung .................... | H10K 50/841 |
| 10,811,463 B2 | 10/2020 | Kim et al. | |
| 10,838,556 B2* | 11/2020 | Yeke Yazdandoost ...................... H10K 50/841 | |
| 10,978,523 B2* | 4/2021 | Park ....................... | H10K 59/40 |
| 11,275,467 B1* | 3/2022 | Gruhlke ................ | G06F 3/0416 |
| 11,507,444 B1* | 11/2022 | Hamlin ................ | G06F 11/0793 |
| 11,837,163 B2* | 12/2023 | Xu ........................ | G06V 10/147 |
| 2014/0161363 A1* | 6/2014 | Sargent ................... | G06F 3/042 382/224 |

(Continued)

FOREIGN PATENT DOCUMENTS

| | | | | |
|---|---|---|---|---|
| CN | 108493215 A | * | 9/2018 | ......... H01L 27/3227 |
| KR | 10-1402838 B1 | | 6/2014 | |

(Continued)

*Primary Examiner* — Patrick F Marinelli
(74) *Attorney, Agent, or Firm* — Lewis Roca Rothgerber Christie LLP

(57) ABSTRACT

A display device includes a display panel, and a sensor panel under the display panel, and including a fingerprint sensor, a proximity sensor between the fingerprint sensor and an edge of the sensor panel, and an illuminance sensor between the fingerprint sensor and the edge of the sensor panel, and adjacent to the proximity sensor.

20 Claims, 17 Drawing Sheets

(56) References Cited

U.S. PATENT DOCUMENTS

| | | | |
|---|---|---|---|
| 2015/0199934 A1* | 7/2015 | Kimura | G09G 3/3406 356/73 |
| 2015/0364107 A1* | 12/2015 | Sakariya | G06F 3/042 345/82 |
| 2017/0116455 A1* | 4/2017 | Alameh | G06V 40/13 |
| 2017/0123542 A1* | 5/2017 | Xie | H10K 59/40 |
| 2018/0164154 A1* | 6/2018 | Roh | G02B 27/1013 |
| 2018/0165533 A1* | 6/2018 | Cho | G09G 5/003 |
| 2018/0315799 A1* | 11/2018 | Jiang | G06V 40/1318 |
| 2019/0013368 A1* | 1/2019 | Chung | H10K 59/351 |
| 2019/0065717 A1* | 2/2019 | Won | G06V 40/1318 |
| 2019/0096959 A1* | 3/2019 | Lee | H10K 50/19 |
| 2019/0115415 A1* | 4/2019 | Choi | G09G 3/3291 |
| 2019/0130822 A1* | 5/2019 | Jung | G09G 3/2003 |
| 2019/0377925 A1* | 12/2019 | Bae | G06F 1/1658 |
| 2020/0111851 A1* | 4/2020 | Park | G06F 21/32 |
| 2020/0292741 A1 | 9/2020 | Rhee et al. | |
| 2020/0312928 A1* | 10/2020 | Chung | H10K 59/65 |
| 2020/0335032 A1* | 10/2020 | Kiik | G06F 3/013 |
| 2020/0380914 A1* | 12/2020 | Jung | G09G 3/2003 |
| 2021/0034832 A1* | 2/2021 | Lee | H10K 59/65 |
| 2021/0064159 A1* | 3/2021 | Yeke Yazdandoost | H01L 31/173 |
| 2021/0065620 A1* | 3/2021 | Yang | G09G 3/3208 |
| 2021/0193759 A1* | 6/2021 | Hyun | G09G 3/3208 |
| 2021/0200366 A1* | 7/2021 | Bok | H10K 59/122 |
| 2021/0210557 A1* | 7/2021 | Lim | H10K 65/00 |
| 2021/0225265 A1* | 7/2021 | Hong | G09G 3/32 |
| 2021/0248344 A1* | 8/2021 | Wu | G06V 40/1318 |
| 2021/0319197 A1* | 10/2021 | Chang | G09G 3/3233 |
| 2021/0343243 A1* | 11/2021 | Takahashi | H01L 27/156 |
| 2021/0399061 A1* | 12/2021 | Ji | H10K 59/352 |
| 2022/0013598 A1* | 1/2022 | Park | H10K 59/352 |
| 2022/0020321 A1* | 1/2022 | Jung | G09G 3/3208 |
| 2022/0028934 A1* | 1/2022 | Kim | G06V 40/1318 |
| 2022/0102463 A1* | 3/2022 | Park | H10K 59/122 |
| 2022/0139331 A1* | 5/2022 | Jang | G09G 3/3275 345/55 |

FOREIGN PATENT DOCUMENTS

| | | |
|---|---|---|
| KR | 10-2018-0103206 A | 9/2018 |
| KR | 10-2018-0103207 A | 9/2018 |
| KR | 10-2019-0036194 A | 4/2019 |

* cited by examiner

DISPLAY DEVICE

CROSS-REFERENCE TO RELATED APPLICATION

This application claims priority to, and the benefit of, Korean Patent Application No. 10-2020-0091543, filed on Jul. 23, 2020, in the Korean Intellectual Property Office, the entire contents of which are hereby incorporated by reference.

BACKGROUND

1. Filed

Embodiments of the present disclosure relate to a display device.

2. Description of the Related Art

Electronic devices, such as smart phones, digital cameras, notebook computers, navigation systems, and smart televisions, which provide images to users, include display devices for displaying images. The display device includes a display panel for generating an image, an input device, such as an input-sensing part, a camera, and various sensors.

The input-sensing part is located on the display panel, and detects a user's touch. The camera captures and stores an external image. Sensors may include fingerprint sensors, proximity sensors, and illuminance sensors.

The fingerprint sensor detects a fingerprint provided on the display panel. The proximity sensor detects objects adjacent to the display device. The proximity sensor includes a light emitting unit that generates and outputs light (e.g., infrared light), and a light receiving unit that senses light reflected from an object. The illuminance sensor detects the luminance around the display device. The fingerprint sensor, the proximity sensor, and the illuminance sensor are each manufactured as separate modules, and are each located in the display device.

SUMMARY

The present disclosure provides a display device capable of arranging a fingerprint sensor, a proximity sensor, and an illuminance sensor in one sensor panel.

Some embodiments of the present disclosure provide a display device including a display panel, and a sensor panel under the display panel, and including a fingerprint sensor, a proximity sensor between the fingerprint sensor and an edge of the sensor panel, and an illuminance sensor between the fingerprint sensor and the edge of the sensor panel, and adjacent to the proximity sensor.

Each of the fingerprint sensor, the proximity sensor, and the illuminance sensor may include at least one photo sensor.

The proximity sensor and the illuminance sensor may be adjacent to the edge of the sensor panel.

The display panel may include a display area including at least one pixel and an infrared light emitting element, and a non-display area around the display area.

The fingerprint sensor, the proximity sensor, and the illuminance sensor may overlap the display area in a plan view.

The infrared light emitting element may overlap the proximity sensor in a plan view.

The infrared light emitting element may be adjacent to the non-display area.

The at least one pixel may include a red pixel, a green pixel, and a blue pixel, wherein the infrared light emitting element has the same size as a light emitting element of the green pixel in a plan view.

The display device may further include an infrared cut filter between the display panel and the sensor panel, and overlapping the fingerprint sensor in a plan view.

The infrared cut filter might not overlap the illuminance sensor in a plan view.

The infrared cut filter might not overlap the proximity sensor in a plan view.

The proximity sensor may be adjacent to an upper end of the sensor panel in a plan view.

The illuminance sensor may be adjacent to left and right sides of the sensor panel in a plan view.

The illuminance sensor may be adjacent to a lower end and left and right sides of the sensor panel in a plan view.

The illuminance sensor may be adjacent to one of left and right sides of the sensor panel in a plan view.

The display panel may include a first display area including a first transmissive area, and a first pixel adjacent the first transmissive area, a second display area around the first display area, and including a second pixel, and a third display area around the second display area, and including a second transmissive area, and a third pixel adjacent the second transmissive area.

The third display area may overlap the illuminance sensor in a plan view.

The third display area may overlap the proximity sensor in a plan view.

Some embodiments of the present disclosure provide a display device including a display panel, a sensor panel under the display panel, and an infrared cut filter between the display panel and the sensor panel, and including a fingerprint sensor, a proximity sensor between the fingerprint sensor and an edge of the sensor panel, and an illuminance sensor between the fingerprint sensor and the edge of the sensor panel, the illuminance sensor being adjacent to the proximity sensor, wherein the infrared cut filter overlaps the fingerprint sensor, and does not overlap the illuminance sensor or the proximity sensor, in a plan view.

The display panel may include at least one pixel, and an infrared light emitting element, wherein the at least one pixel includes a red pixel, a green pixel, and a blue pixel, and wherein the infrared light emitting element overlaps the proximity sensor, and has the same size as a light emitting element of the green pixel, in a plan view.

BRIEF DESCRIPTION OF THE DRAWINGS

The accompanying drawings are included to provide a further understanding of the present disclosure, and are incorporated in, and constitute a part of, this specification. The drawings illustrate embodiments of the present disclosure and, together with the description, serve to explain aspects of the present disclosure. In the drawings.

DETAILED DESCRIPTION

Figure 1:
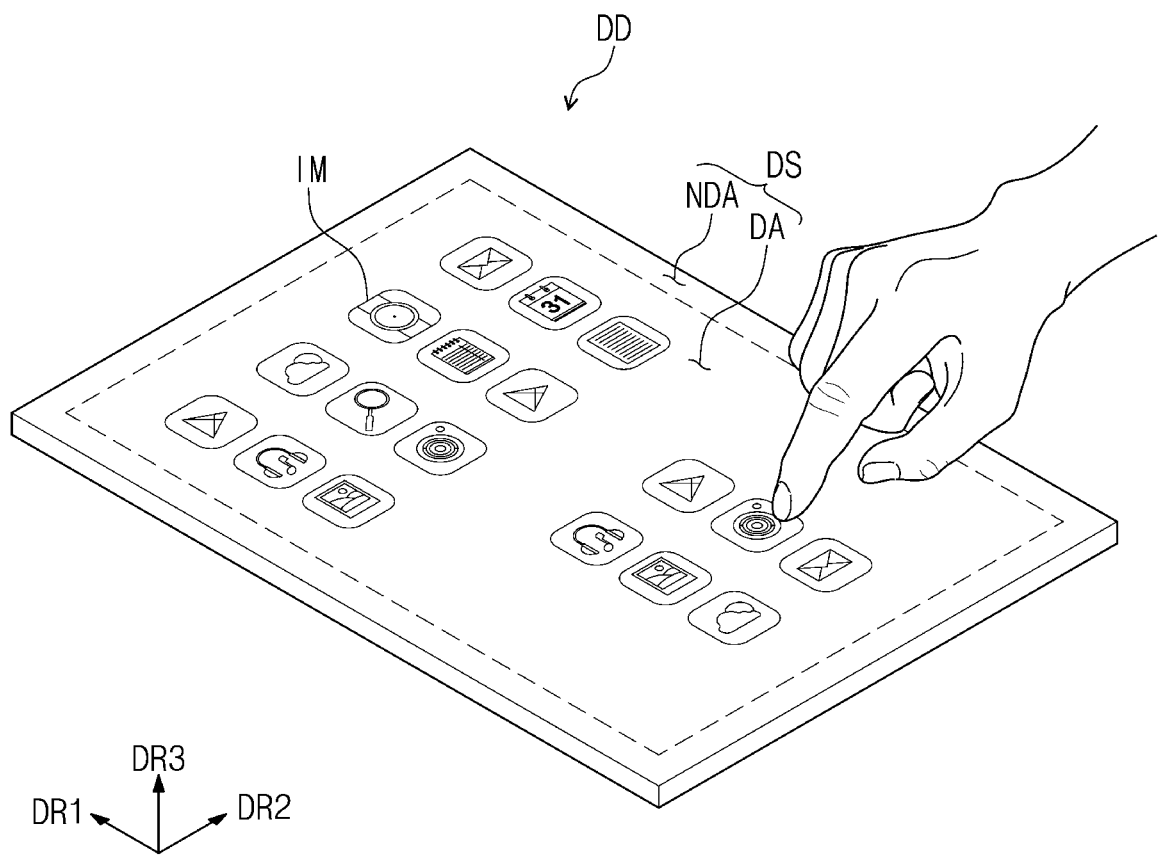
FIG. 1 is a perspective view of a display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device according to some embodiments of the present disclosure.

Referring to FIG. 1, a display device DD according to some embodiments of the present disclosure may have a rectangular shape with long sides extending in a first direction DR1, and short sides extending in a second direction DR2 crossing the first direction DR1. However, the present disclosure is not limited thereto, and the display device DD may have various shapes, such as a circle or a polygon.

Hereinafter, the direction substantially perpendicular to the plane defined by the first direction DR1 and the second direction DR2 is defined as a third direction DR3. In addition, in this specification, the meaning of "when viewed on a plane" may mean a state viewed from the third direction DR3.

The upper surface of the display device DD may be defined as the display surface DS, and may have a plane defined by the first direction DR1 and the second direction DR2. The images IM generated by the display device DD may be perceived by the user through the display surface DS.

The display surface DS may include a display area DA, and a non-display area NDA around the display area DA. The display area DA may display an image, and the non-display area NDA might not display an image. The non-display area NDA may surround the display area DA, and may define an outline portion of the display device DD, which may be printed to have a color (e.g., printed in a predetermined color).

The display device DD may be used in large electronic devices, such as a television, a monitor, or an external billboard. In addition, the display device DD may be used in small- and medium-sized electronic devices, such as a personal computer, a notebook computer, a personal digital terminal, a car navigation system, a game machine, a smart phone, a tablet, or a camera. However, these are presented only as some of the embodiments, and the display device DD may be used in other electronic devices without departing from the general concept of the present disclosure.

Figure 2:
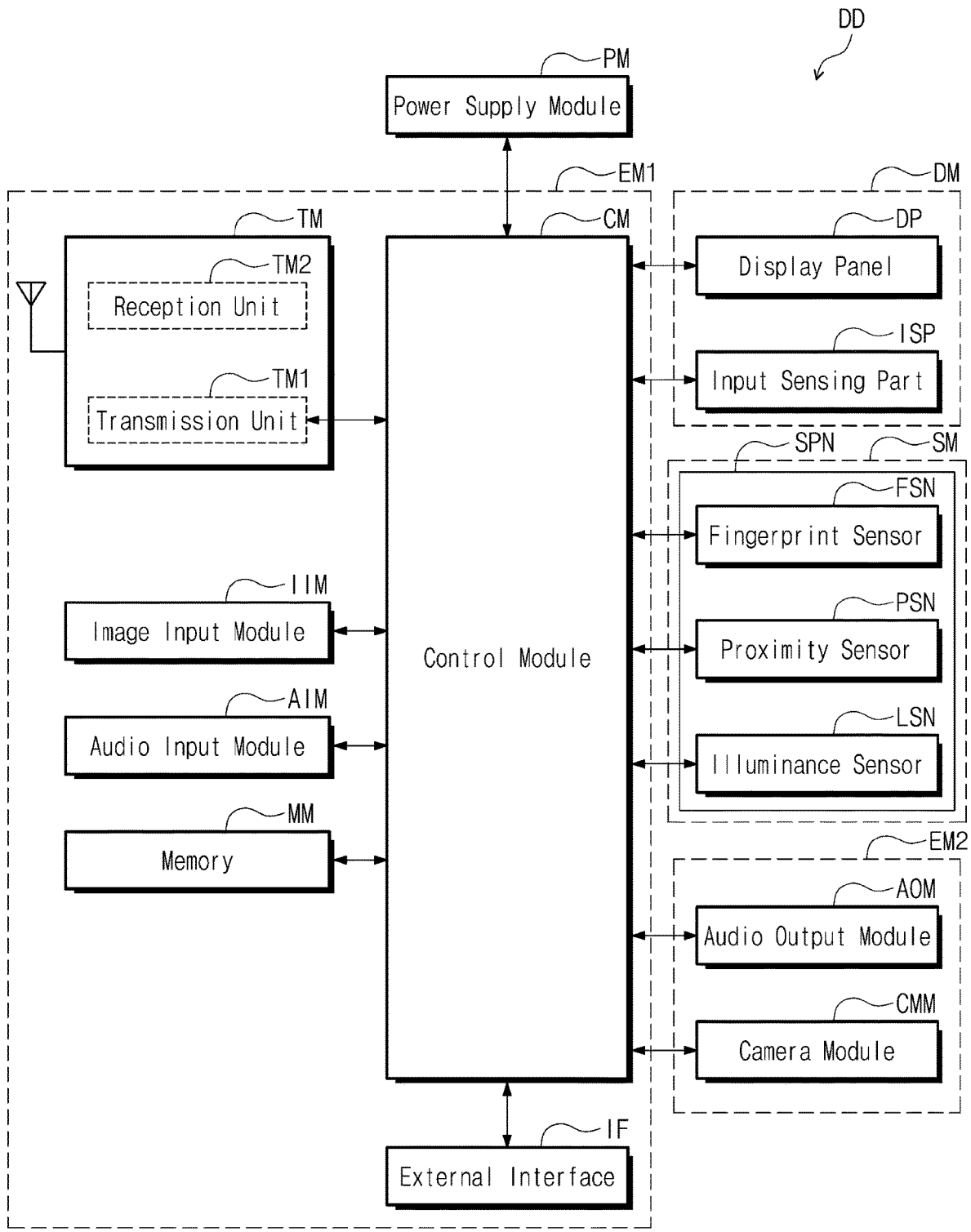
FIG. 2 is a block diagram of the display device shown in FIG. 1.

FIG. 2 is a block diagram of the display device shown in FIG. 1.

Referring to FIG. 2, a display device DD according to some embodiments of the present disclosure may include a display module DM, a power supply module PM, a first electronic module EM1, a second electronic module EM2, and a sensor module SM. The display module DM, the power supply module PM, the first electronic module EM1, the second electronic module EM2, and the sensor module SM may be electrically connected to each other.

The power supply module PM may supply power necessary for the overall operation of the display device DD. The power supply module PM may include a conventional battery module.

The first electronic module EM1 and the second electronic module EM2 may include various functional modules for operating the display device DD. The first electronic module EM1 may be directly mounted on a main board electrically connected to the display module DM, or may be mounted on a separate board and electrically connected to the main board through a connector, in some embodiments.

The first electronic module EM1 may include a control module CM, a wireless communication module TM, an image input module IIM, an audio input module AIM, a memory MM, and an external interface IF. Some of the modules are not mounted on the main board, but may be electrically connected to the main board through a flexible circuit board.

The control module CM may control the overall operation of the display device DD. The control module CM may activate or deactivate the display module DM. The control module CM may control other modules, such as the image input module IIM or the audio input module AIM, based on a touch signal received from the display module DM. The control module CM may control an operation of the display device DD in response to a signal detected by the sensor module SM.

The wireless communication module TM may transmit/receive wireless signals to/from other terminals using, for example, a Bluetooth or Wi-Fi line, and may transmit/receive voice signals using, for example, a general communication line. The wireless communication module TM may include a transmission unit TM1 that modulates and transmits a signal to be transmitted, and a reception unit TM2 that demodulates a received signal.

The image input module IIM may process an image signal and convert the processed image signal into image data that may be displayed on the display module DM. The audio input module AIM may receive an external sound signal by a microphone in a recording mode or in a voice recognition mode, and may convert the received external sound signal into electrical voice data.

The external interface IF may serve as an interface connected to an external charger, a wired/wireless data port, and a card socket (e.g., a memory card, a SIM/UIM card, and the like).

The second electronic module EM2 may include an audio output module AOM and a camera module CMM. The audio output module AOM and the camera module CMM may be mounted directly on the main board or on separate boards, and may be electrically connected to the display module DM through a connector or the like, or may be electrically connected to the first electronic module EM1.

The audio output module AOM may convert audio data received from the wireless communication module TM or audio data stored in the memory MM to be outputted to the outside. The camera module CMM may capture an external image.

The sensor module SM may include a sensor panel SPN, and the sensor panel SPN may include a fingerprint sensor FSN, a proximity sensor PSN, and an illuminance sensor LSN. The fingerprint sensor FSN, the proximity sensor PSN, and the illuminance sensor LSN may be located on a single sensor panel SPN.

The fingerprint sensor FSN may detect a fingerprint provided on the display module DM. The control module CM may receive fingerprint information detected by the fingerprint sensor FSN, and may implement a user authentication mode using the received fingerprint information.

The proximity sensor PSN may detect an object around the display device DD. The control module CM may control the operation of the display module DM according to information detected by the proximity sensor PSN. For example, when the display device DD is a mobile phone, the control module CM may turn off the screen of the display device DD when the user holds the mobile phone to their ear to make a phone call to reduce power consumption of the display device DD.

The illuminance sensor LSN may detect luminance around the display device DD. The control module CM may control the operation of the display module DM according to information detected by the illuminance sensor LSN. For example, when the peripheral luminance is large, the control module CM may increase the luminance of light generated by the display module DM, and when the peripheral luminance is low, the control module CM may lower the luminance of light generated by the display module DM.

The display module DM may include a display panel DP and an input-sensing part ISP. The display panel DP may display an image using image data provided from the control module CM.

The input-sensing part ISP may detect an external input (such as a user's hand or a touch pen), and the detected signal may be transmitted as an input signal to the control module CM. The control module CM may control an operation of the display panel DP in response to an input signal.

Figure 3:
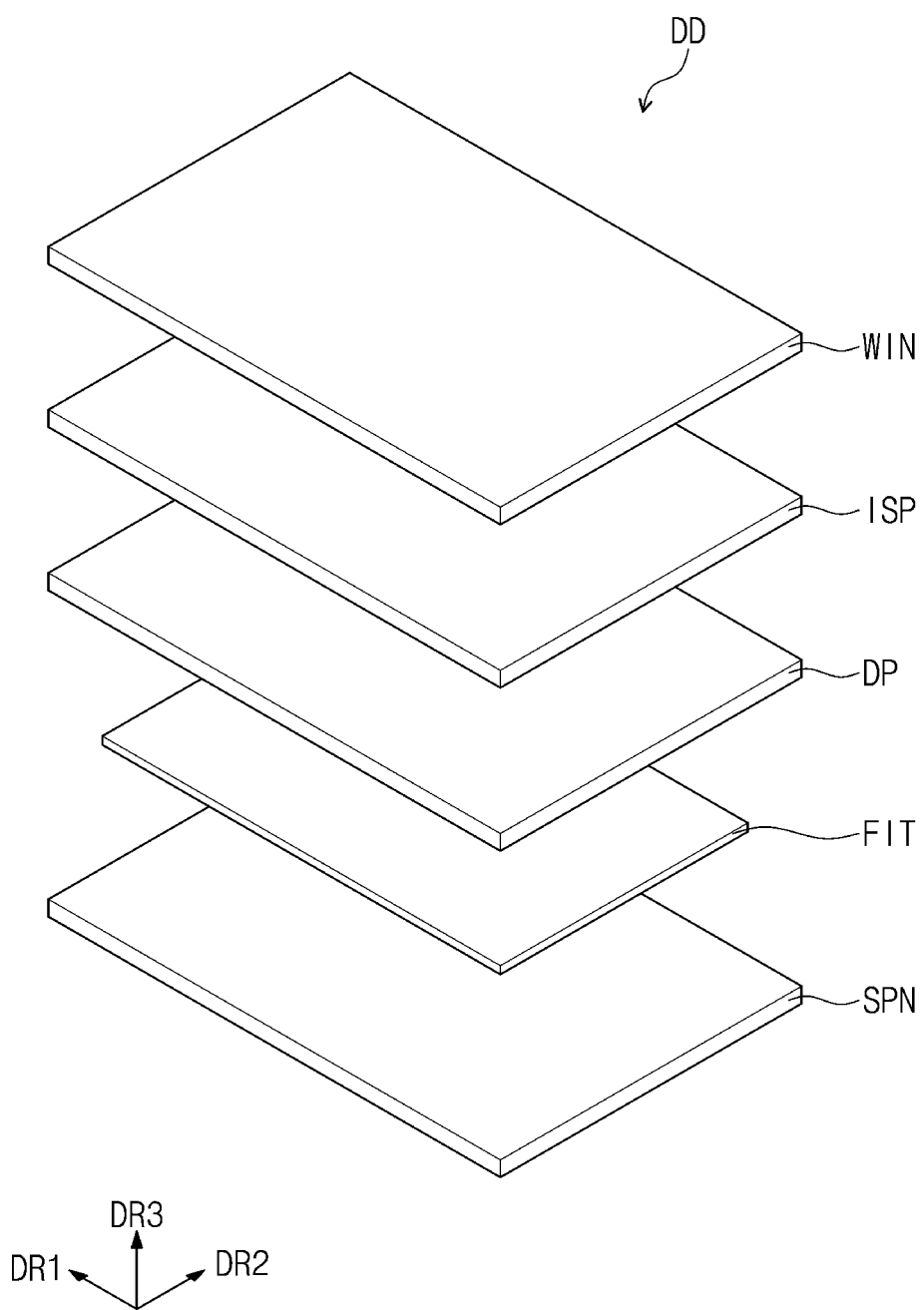
FIG. 3 is an exploded perspective view of the display device shown in FIG. 2.

FIG. 3 is an exploded perspective view of the display device shown in FIG. 2.

By way of example, some configurations of the various modules shown in FIG. 2 are shown in FIG. 3.

Referring to FIG. 3, the display device DD may include a display panel DP, an input-sensing part ISP, a window WIN, an infrared cut filter FIT, and a sensor panel SPN. The input-sensing part ISP may be located on the display panel DP, and the window WIN may be located on the input-sensing part ISP. The infrared cut filter FIT may be located under the display panel DP, and the sensor panel SPN may be located under the infrared cut filter FIT.

The display panel DP may be a flexible display panel. For example, the display panel DP may include a plurality of electronic elements located on a flexible substrate. The display panel DP according to some embodiments of the present disclosure may be a light-emitting display panel.

The display panel DP may be an organic light emitting display panel or a quantum dot light emitting display panel. In the organic light emitting display panel, the emission layer may include an organic light emitting material. The emission layer of the quantum dot light emitting display panel may include quantum dot, quantum rod, and the like. Hereinafter, the display panel DP is described as the organic light emitting display panel.

The input-sensing part ISP may include a plurality of sensor units for detecting an external input. The sensor units may detect an external input in a capacitive method. The input-sensing part ISP may be directly manufactured on the display panel DP when the display panel DP is manufactured. However, the present disclosure is not limited thereto, and the input-sensing part ISP may be manufactured as a panel that is separated from the display panel DP, and then may be attached to the display panel DP by an adhesive.

The window WIN may protect the display panel DP and the input-sensing part ISP from external scratches and impacts. The image generated by the display panel DP may pass through the window WIN to be provided to the user.

In other embodiments, to reduce or prevent reflection of external light, the display device DD may further include an anti-reflection layer located between the window WIN and the input-sensing part ISP. The anti-reflection layer may reduce reflectance of external light incident from the display device DD toward the display panel DP.

The infrared cut filter FIT may block infrared rays of external light. Infrared rays directed to the sensor panel SPN from outside may be blocked by the infrared cut filter FIT.

The sensor panel SPN may include a plurality of optical sensors for detecting light. Each of the optical sensors may include a photodiode. The sensor panel SPN may be divided into a fingerprint sensor FSN, a proximity sensor PSN, and an illuminance sensor LSN according to an arrangement area. The configuration of the sensor panel SPN will be described in detail below. The fingerprint sensor FSN, the proximity sensor PSN, and the illuminance sensor LSN may include photodiodes as the same elements.

Figure 4:
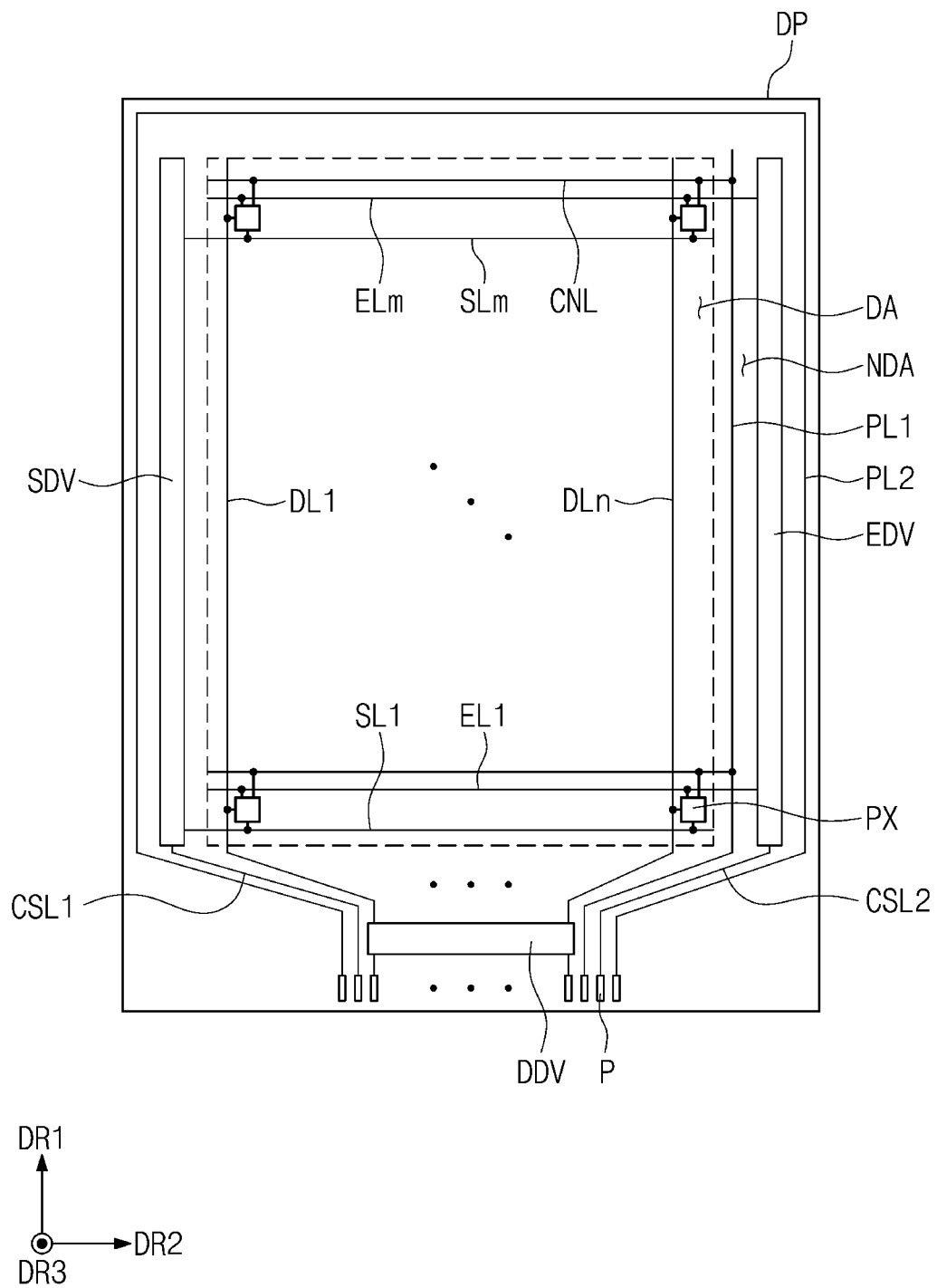
FIG. 4 is a plan view of the display panel shown in FIG. 3.

FIG. 4 is a plan view of the display panel shown in FIG. 3.

Referring to FIG. 4, a display device DD may include a display panel DP, a scan driver SDV, a data driver DDV, and an emission driver EDV. The display panel DP may have a rectangular shape having long sides extending in the first direction DR1, and short sides extending in the second direction DR2, but the shape of the display panel DP is not limited thereto. The display panel DP may include a display area DA, and a non-display area NDA surrounding the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, connection lines CNL, and a plurality of pads P. As described herein, m and n are natural numbers.

The pixels PX may be located in the display area DA. The scan driver SDV and the emission driver EDV may be located in the non-display area NDA adjacent to respective long sides of the display panel DP. The data driver DDV may be located in the non-display area NDA adjacent to one of the short sides of the display panel DP. When viewed on a plane, the data driver DDV may be adjacent to the lower end of the display panel DP. The data driver DDV may be manufactured in the form of an integrated circuit chip and mounted on the display panel DP.

The scan lines SL1 to SLm may extend in the second direction DR2 and may be connected to the pixels PX and the scan driver SDV. The data lines DL1 to DLn may extend in the first direction DR1 to be connected to the pixels PX and the data driver DDV. The emission lines EL1 to ELm may extend in the second direction DR2 to be connected to the pixels PX and the emission driver EDV.

The first power line PL1 may extend in the first direction DR1, and may be located in the non-display area NDA. The first power line PL1 may be located between the display area DA and the emission driver EDV, but the embodiments are not limited thereto, and the first power line PL1 may be located between the display area DA and the scan driver SDV in other embodiments.

The connection lines CNL may extend in the second direction DR2 and may be arranged in the first direction DR1. The connection lines CNL may be connected to the first power line PL1 and respective ones of the pixels PX. The first voltage may be applied to the pixels PX through the first power line PL1 and the connection lines CNL.

The connection lines CNL may be integrally formed with the first power line PL1 to extend from the first power line PL1. However, the present disclosure is not limited thereto, and the connection lines CNL may be located on a layer different from the first power line PL1 and may be connected to the first power line PL1 through separate connection electrodes. The connection lines CNL may also be referred to as a first power line PL1.

The second power line PL2 may be located in the non-display area NDA. The second power line PL2 may extend along long sides of the display panel DP and along the other short side of the display panel DP on which the data driver DDV is not located. The second power line PL2 may be located outside the scan driver SDV and the emission driver EDV.

In other embodiments, the second power line PL2 may extend toward the display area DA to be connected to the pixels PX. A second voltage having a level lower than the first voltage may be applied to the pixels PX through the second power line PL2.

The first control line CSL1 may be connected to the scan driver SDV and may extend toward the lower end of the display panel DP when viewed on a plane. The second control line CSL2 may be connected to the emission driver EDV and may extend toward the lower end of the display panel DP when viewed on a plane. The data driver DDV may be located between the first control line CSL1 and the second control line CSL2.

The pads P may be located on the display panel DP adjacent to the lower end of the display panel DP. The data driver DDV, the first power line PL1, the second power line PL2, the first control line CSL1, and the second control line CSL2 may be connected to the pads P. The data lines DL1 to DLn may be connected to the data driver DDV, and the data driver DDV may be connected to the pads P corresponding to the data lines DL1 to DLn.

In other embodiments, the display device DD may include a timing controller for controlling operations of the scan driver SDV, the data driver DDV, and the emission driver EDV, and a voltage generation unit for generating first and second voltages. The timing controller and the voltage generation unit may be connected to the pads P.

The timing controller may generate a scan control signal, a data control signal, and an emission control signal. The scan control signal may be provided to the scan driver SDV through the first control line CSL1. The emission control signal may be provided to the emission driver EDV through the second control line CSL2. The data control signal may be provided to the data driver DDV. The timing controller may provide image signals to the data driver DDV.

The scan driver SDV may generate a plurality of scan signals in response to the scan control signal, and the scan signals may be applied to the pixels PX through the scan lines SL1 to SLm. The emission driver EDV may generate a plurality of emission signals in response to the emission control signal, and the emission signals may be applied to the pixels PX through the emission lines EL1 to ELm.

The data driver DDV may generate a plurality of data voltages corresponding to the image signals in response to the data control signal. The data voltages may be applied to the pixels PX through the data lines DL1 to DLn.

The pixels PX may be provided with the data voltages in response to the scan signals. The pixels PX may display an image by emitting light having luminance corresponding to data voltages in response to emission signals. The emission time of the pixels PX may be controlled by emission signals.

Figure 5:
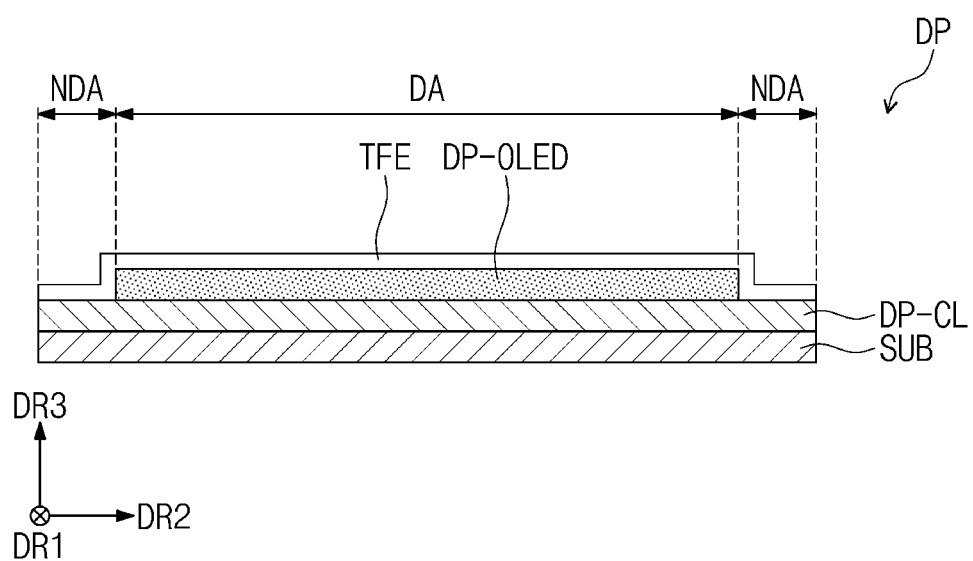
FIG. 5 is a diagram illustrating a cross-section of the display panel shown in FIG. 4 by way of example.

FIG. 5 is a diagram illustrating a cross-section of the display panel shown in FIG. 4, by way of example.

For example, in FIG. 5, a cross-section of the display panel DP viewed from the first direction DR1 is illustrated. Referring to FIG. 5, the display panel DP may include a substrate SUB, a circuit element layer DP-CL located on the substrate SUB, a display element layer DP-OLED located on the circuit element layer DP-CL, and a thin film sealing layer TFE located on the display element layer DP-OLED.

The substrate SUB may include a display area DA, and a non-display area NDA around the display area DA. The display element layer DP-OLED may be located on the display area DA. The substrate SUB may include a flexible plastic material such as polyimide (PI).

A plurality of pixels may be located on the circuit element layer DP-CL and on the display element layer DP-OLED. Each of the pixels may include at least one transistor located on the circuit element layer DP-CL, and a light emitting element located on the display element layer DP-OLED and connected to the transistor.

The thin film sealing layer TFE may be located on the circuit element layer DP-CL to cover the display element layer DP-OLED. The thin film sealing layer TFE may include an inorganic layer, an organic layer, and an inorganic layer sequentially stacked. The inorganic layers may include an inorganic material, and may protect the pixels from moisture/oxygen. The organic layer may include an organic material, and may protect the pixels from foreign substances such as dust particles.

When manufacturing the display device DD, the input-sensing part ISP may be directly located on the thin film sealing layer TFE.

Figure 6:
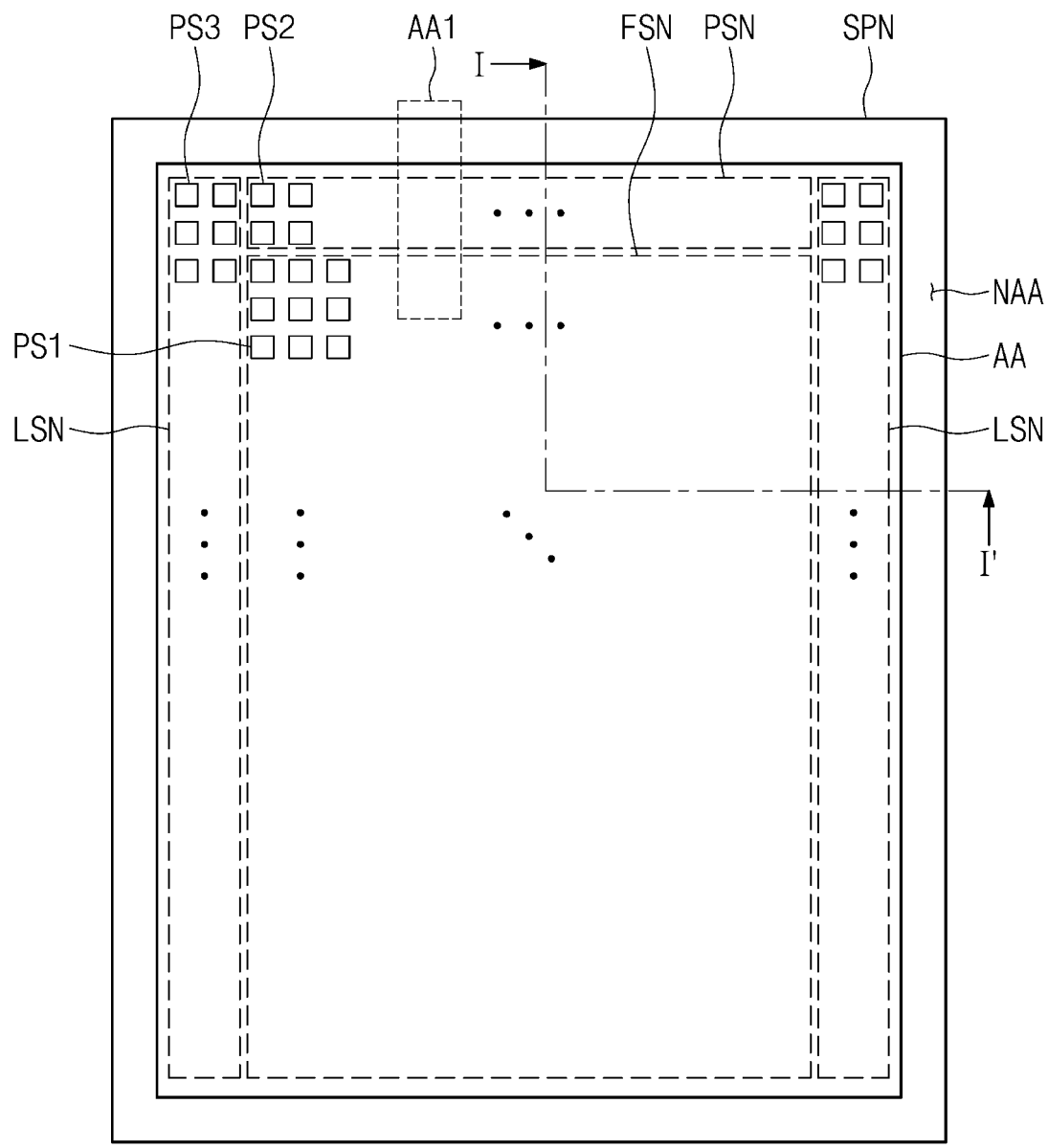
FIG. 6 is a plan view of the sensor panel shown in FIG. 3.
Figure 7:
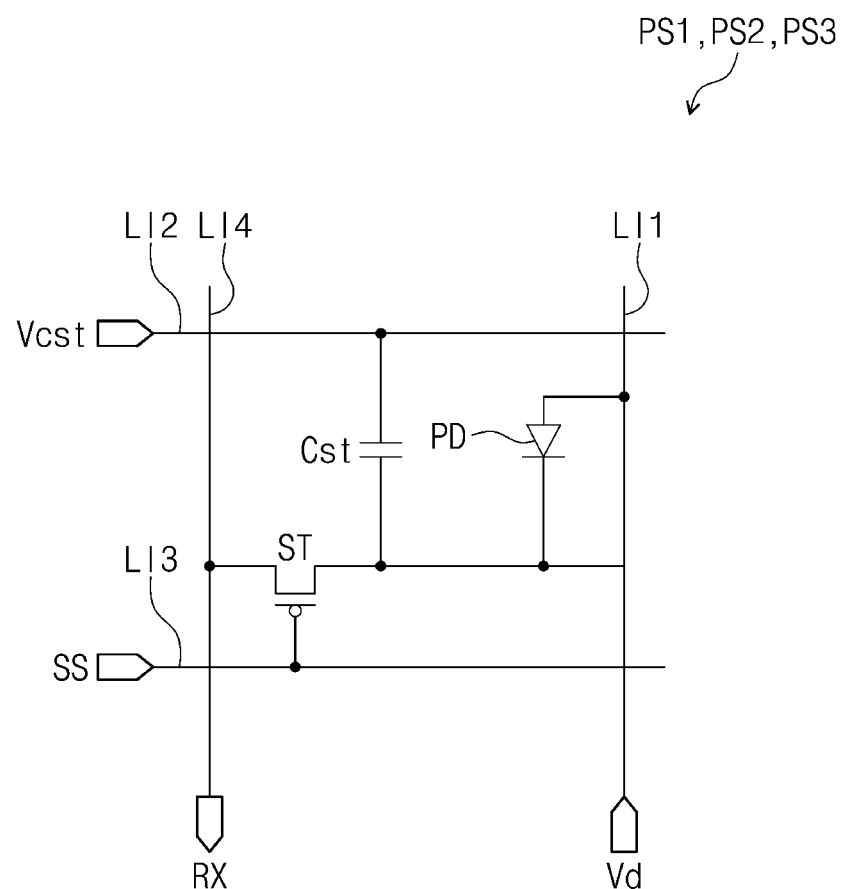
FIG. 7 is an equivalent circuit diagram of any one photo sensor shown in FIG. 6.

FIG. 6 is a plan view of the sensor panel shown in FIG. 3, and FIG. 7 is an equivalent circuit diagram of any one photo sensor shown in FIG. 6.

Referring to FIG. 6, the sensor panel SPN may include an active area AA, and an inactive area NAA around the active area AA. The inactive area NAA may surround the active area AA in a plan view.

The sensor panel SPN may include a plurality of photo sensors PS1, PS2, and PS3. The photo sensors PS1, PS2, and PS3 may be located in the active area AA. In other embodiments, a processing circuit for processing sensing signals outputted from the photo sensors PS1, PS2, and PS3 may be connected to the sensor panel SPN.

Referring to FIG. 7, each of the photo sensors PS1, PS2, and PS3 may include a photodiode PD, a switching transistor ST, and a storage capacitor Cst. The anode of the photodiode PD may be connected to a first wiring LI1, and the cathode of the photodiode PD may be connected to the source of the switching transistor ST. A driving voltage Vd may be supplied to the photodiode PD through the first wiring LI1.

The storage capacitor Cst may be connected to a second wiring LI2 and to the source of the switching transistor ST. A storage voltage Vcst may be applied to the second wiring LI2.

A gate of the switching transistor ST may be connected to a third wiring LI3, and a drain of the switching transistor ST may be connected to a fourth wiring LI4.

The photodiode PD is driven, and the photodiode PD may convert light energy incident from the outside into electrical energy. The storage capacitor Cst may accumulate electric energy as electric charge.

A switching signal SS may be applied to the switching transistor ST through the third line LI3, and the switching transistor ST may be turned on by the switching signal SS. Charges accumulated in the storage capacitor Cst may be outputted as a sensing signal Rx through the turned-on switching transistor ST and the fourth wiring LI4. The fourth wiring LI4 may be defined as a lead-out wiring.

Referring to FIG. 6, the sensor panel SPN may include a fingerprint sensor FSN, a proximity sensor PSN, and an illuminance sensor LSN. The fingerprint sensor FSN, the proximity sensor PSN, and the illuminance sensor LSN may be located in the active area AA. For example, the area where the fingerprint sensor FSN is located is defined as a rectangular area, but the area where the fingerprint sensor FSN is located is not limited thereto in other embodiments.

The proximity sensor PSN may be located between the fingerprint sensor FSN and the edge of the sensor panel SPN. The illuminance sensor LSN may be located between the fingerprint sensor FSN and the edge of the sensor panel SPN, and may be located adjacent to the proximity sensor PSN. The proximity sensor PSN and the illuminance sensor LSN may be adjacent to the edge of the sensor panel SPN.

The proximity sensor PSN may be located adjacent to the upper end of the sensor panel SPN when viewed on a plane. The illuminance sensor LSN may be located adjacent to the left and right sides of the sensor panel SPN when viewed on a plane.

The fingerprint sensor FSN, the proximity sensor PSN, and the illuminance sensor LSN may include photo sensors PS1, PS2, and PS3. The fingerprint sensor FSN may include a plurality of first photo sensors PS1 among the photo sensors PS1, PS2, and PS3. The proximity sensor PSN may include a plurality of second photo sensors PS2 among the photo sensors PS1, PS2, and PS3. The illuminance sensor LSN may include a plurality of third photo sensors PS3 among the photo sensors PS1, PS2, and PS3.

Substantially, according to the placement location, the photo sensors PS1, PS2, and PS3 may be classified into the first photo sensors PS1 of the fingerprint sensor FSN, the second photo sensors PS2 of the proximity sensor PSN, and the third photo sensors PS3 of the illuminance sensor LSN.

Figure 8:
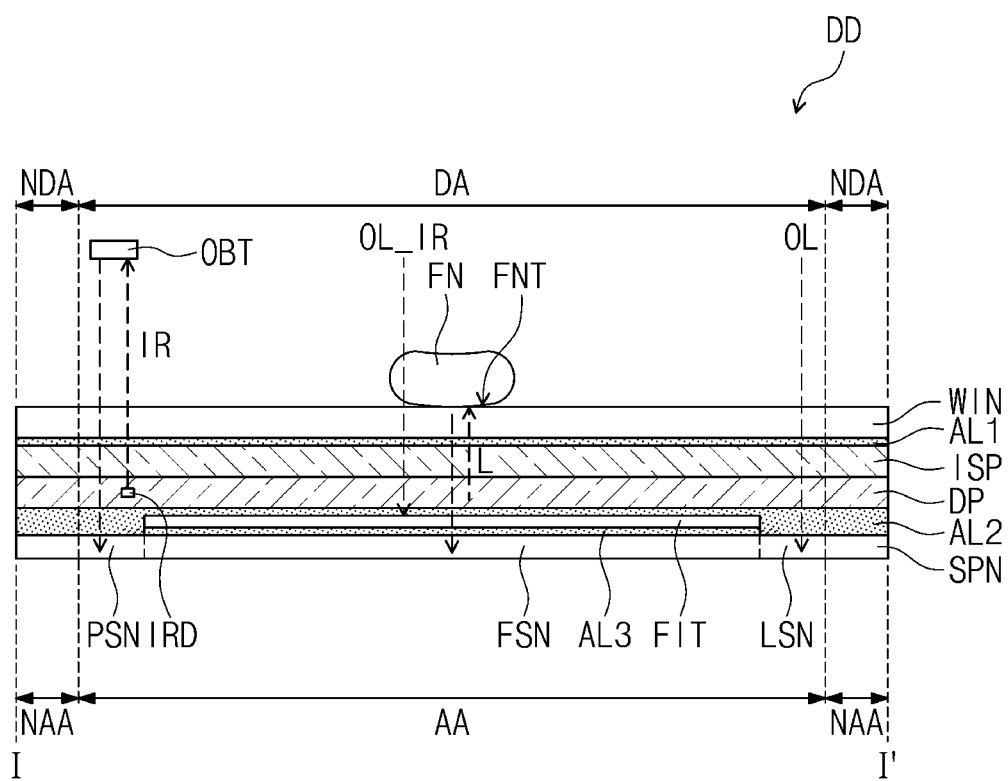
FIG. 8 is a cross-sectional view taken along the line I-I' shown in FIG. 6.

FIG. 8 is a cross-sectional view taken along the line I-I' shown in FIG. 6.

Referring to FIG. 8, a window WIN may be located on the input-sensing part ISP, and a first adhesive layer AL1 may be located between the window WIN and the input-sensing part ISP. The window WIN may be attached to the input-sensing part ISP by the first adhesive layer AL1.

The sensor panel SPN is located under the display panel DP, and the infrared cut filter FIT may be located between the display panel DP and the sensor panel SPN. The infrared cut filter FIT may overlap the fingerprint sensor FSN when viewed on a plane.

The infrared cut filter FIT might not be located on the proximity sensor PSN. Therefore, when viewed on a plane, the infrared cut filter FIT might not overlap the proximity sensor PSN.

The infrared cut filter FIT may not be located on the illuminance sensor LSN. Therefore, when viewed on a plane, the infrared cut filter FIT may not overlap the illuminance sensor LSN.

A second adhesive layer AL2 may be located between the display panel DP and the sensor panel SPN. The second adhesive layer AL2 may be located between the display panel DP and the infrared cut filter FIT. A third adhesive layer AL3 may be located between the infrared cut filter FIT and the sensor panel SPN.

The display panel DP may be attached to the sensor panel SPN and the infrared cut filter FIT by the second adhesive layer AL2. The infrared cut filter FIT may be attached to the sensor panel SPN by the third adhesive layer AL3.

The first, second, and third adhesive layers AL1, AL2, and AL3 may include various adhesives, such as an optical clear adhesive or a pressure sensitive adhesive.

When viewed on a plane, the active area AA of the sensor panel SPN may overlap the display area DA of the display panel DP. When viewed on a plane, the inactive area NAA of the sensor panel SPN may overlap the non-display area NDA of the display panel DP. When viewed on a plane, the fingerprint sensor FSN, the proximity sensor PSN, and the illuminance sensor LSN may overlap the display area DA.

The display panel DP may include at least one infrared light emitting element IRD that is located on the display area DA to generate infrared rays IR. When viewed on a plane, the infrared light emitting element IRD may be adjacent to the non-display area NDA. When viewed on a plane, the infrared light emitting element IRD may overlap the proximity sensor PSN.

The fingerprint sensor FSN may detect the fingerprint FNT of the finger FN provided on the display panel DP. Light L generated by the pixels PX located in the display area DA may be provided to the fingerprint FNT and reflected from the fingerprint FNT. Light reflected from the fingerprint FNT may be provided to the fingerprint sensor FSN. The fingerprint sensor FSN may detect the fingerprint FNT through light reflected from the fingerprint FNT.

Light IR (infrared ray) generated by the infrared light emitting element IRD may be reflected by an object OBT close to the display device DD, and may be detected by the proximity sensor PSN. The infrared light emitting element IRD may be defined as a light emitting unit, and the proximity sensor PSN may be defined as a light receiving unit. Substantially, an object OBT close to the display device DD may be detected by the infrared light emitting element IRD and the proximity sensor PSN.

The external light OL may be provided to the illuminance sensor LSN. The illuminance sensor LSN may detect the luminance of the external light OL.

When infrared light OL_IR of external light OL passes through the fingerprint and is provided to the fingerprint sensor FSN, the fingerprint FNT may not be normally detected. The infrared cut filter FIT may reduce or block the infrared OL_IR of the external light OL that would be otherwise provided to the fingerprint sensor FSN.

Because the infrared cut filter FIT is not located on the proximity sensor PSN, the infrared IR may be provided to the proximity sensor PSN. In addition, because the infrared cut filter FIT is not placed on the illuminance sensor LSN, the infrared ray OL_IR of the external light OL is not blocked on the illuminance sensor LSN, and as a result, the amount of light received by the illuminance sensor LSN may increase.

Figure 9:
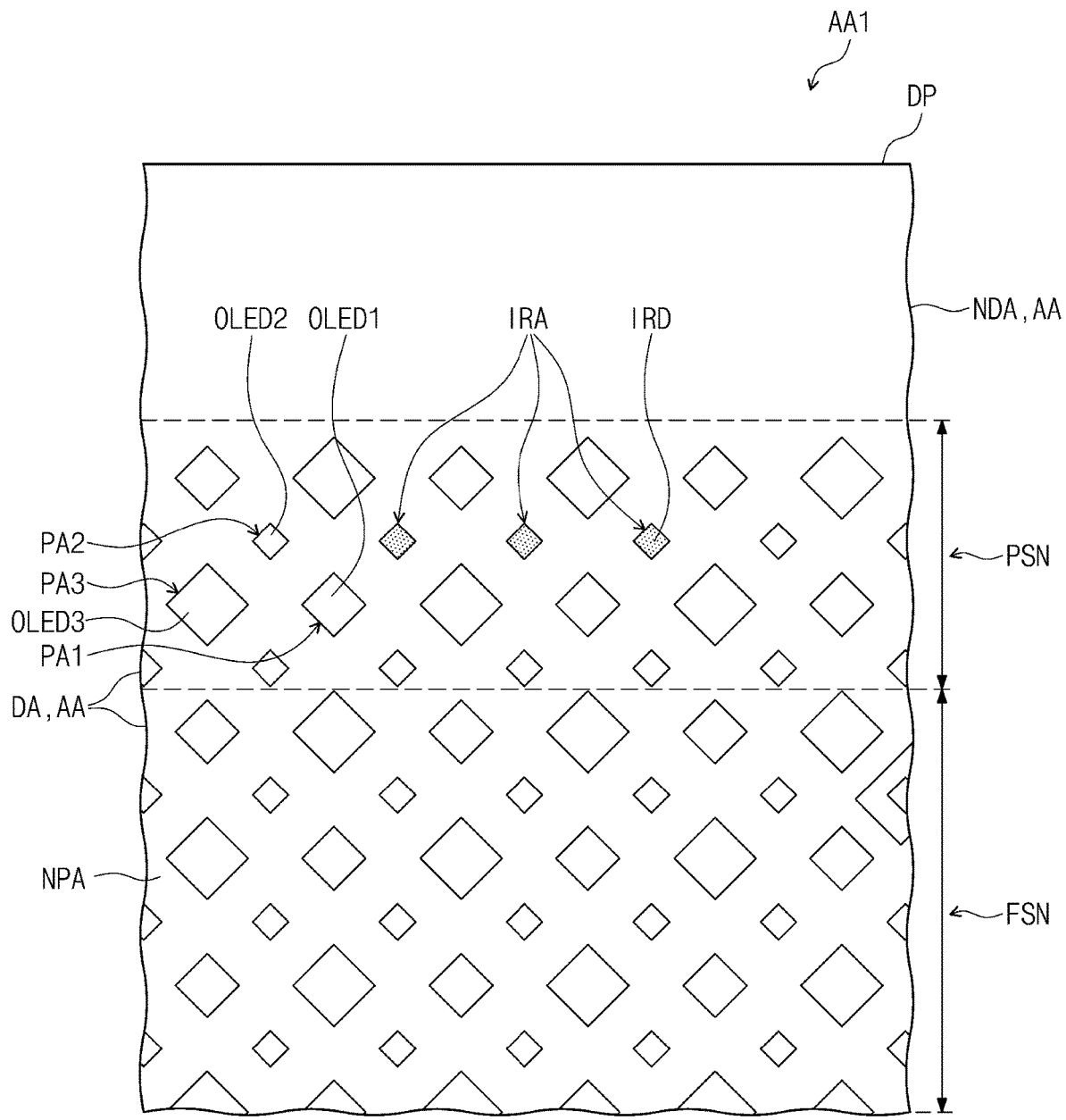
FIG. 9 is an enlarged view of a portion of the display panel corresponding to the first area AA1 illustrated in FIG. 6.

FIG. 9 is an enlarged view of a portion of the display panel corresponding to the first area AA1 illustrated in FIG. 6.

Referring to FIG. 9, the display area DA may include a plurality of emission areas PA1, PA2, and PA3 and a non-emission area NPA around each of the emission areas PA1, PA2, and PA3. The emission areas PA1, PA2, and PA3 may be arranged in a first diagonal direction DDR1 and a second diagonal direction DDR2.

The first diagonal direction DDR1 may be defined as a direction intersecting, or between, the first and second directions DR1 and DR2 on a plane defined by the first and second directions DR1 and DR2. The second diagonal direction DDR2 may be defined as a direction crossing the first diagonal direction DDR1 on a plane defined by the first and second directions DR1 and DR2.

The emission areas PA1, PA2, and PA3 may include a plurality of first emission areas PA1 displaying red, a plurality of second emission areas PA2 displaying green, and a plurality of third emission areas PA3 displaying blue.

The third emission areas PA3 may be larger than the first emission areas PA1, and the first emission areas PA1 may be larger than the second emission areas PA2. The first, second, and third emission areas PA1, PA2, and PA3 may each have a rhombus shape, but the shapes of the first, second, and third emission areas PA1, PA2, and PA3 are not limited thereto.

First light emitting elements OLED1 may be located in the first emission areas PA1. Second light emitting elements OLED2 may be located in the second emission areas PA2. Third light emitting elements OLED3 may be located in the third emission areas PA3.

The pixels PX illustrated in FIG. 4 may include a plurality of red pixels, a plurality of green pixels, and a plurality of blue pixels. The red pixels may include first light emitting elements OLED1. The green pixels may include second light emitting elements OLED2. The blue pixels may include third light emitting elements OLED3.

The display area DA may include a plurality of infrared emission areas IRA. When viewed on a plane, each of the infrared emission areas IRA may have the same size as each of the second emission areas PA2. The infrared emission areas IRA may be respectively located between some of (e.g., respective ones of) the first emission areas PA1, and between some of (e.g., respective ones of) the third emission areas PA3, in the first and second diagonal directions DDR1 and DDR2. As an example, three infrared emission areas IRA are illustrated, but the number of infrared emission areas IRA is not limited thereto.

Infrared light emitting elements IRD may be located in respective ones of the infrared emission areas IRA. When viewed on a plane, each of the infrared light emitting elements IRD may have the same size as each of the second light emitting elements OLED2. The display device DD may include infrared pixels. Each of the infrared pixels may include infrared light emitting elements IRD.

Figure 10:
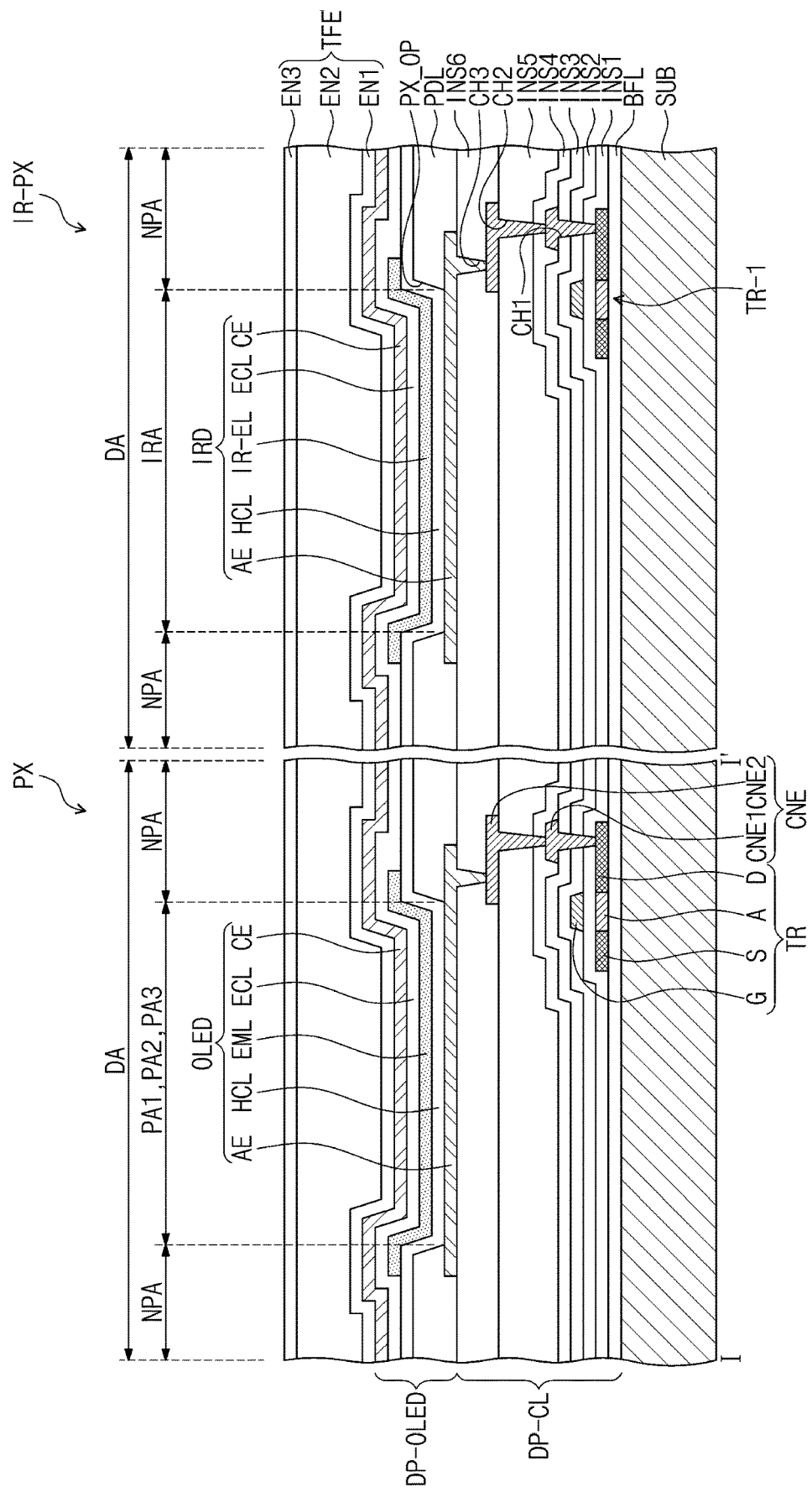
FIG. 10 is a diagram illustrating a cross-section of one emission area and one infrared emission area shown in FIG. 9 by way of example.

FIG. 10 is a diagram illustrating a cross-section of one emission area and one infrared emission area shown in FIG. 9 by way of example.

Referring to FIG. 10, a pixel PX and an infrared pixel IR-PX may be located on a substrate SUB. The display area DA may include an emission area PA corresponding to the pixel PX and a non-emission area NPA around the emission area PA. The emission area PA may be any one of the first, second, and third emission areas PA1, PA2, and PA3 shown in FIG. 9. The display area DA may include an infrared emission area IRA corresponding to the infrared pixels IR-PX. The non-emission area NPA may be located around the infrared emission area IRA.

The pixel PX may include a transistor TR, and a light emitting element OLED connected to the transistor TR. The infrared pixel IR-PX may include a transistor TR-1, and an infrared light emitting element IRD connected to the transistor TR-1. Because the transistor TR of the pixel PX and the transistor TR-1 of the infrared pixel IR-PX have substantially the same configuration, the configuration of the transistor TR of the pixel PX will be mainly described below.

The light emitting element OLED may include a first electrode AE, a second electrode CE, a hole control layer HCL, an electronic control layer ECL, and an emission layer EML. The first electrode AE may be an anode electrode, and the second electrode CE may be a cathode electrode. The light emitting element OLED may be any one of the first, second, and third light emitting elements OLED1, OLED2, and OLED3 shown in FIG. 9.

The infrared light emitting element IRD may include a first electrode AE, a second electrode CE, a hole control layer HCL, an electronic control layer ECL, and an infrared emission layer IR-EL. The first electrode AE, the second electrode CE, the hole control layer HCL, and the electronic control layer ECL of the infrared light emitting element IRD may have the same configuration as the first electrode AE, the second electrode CE, the hole control layer HCL, and the electronic control layer ECL of the light emitting element. Therefore, hereinafter, the configuration of a light emitting element OLED will be mainly described.

As an example, one transistor TR of the pixel PX is illustrated, but substantially, the pixel PX may include a plurality of transistors and at least one capacitor for driving the light emitting element OLED.

The substrate SUB may include a flexible plastic substrate. For example, the substrate SUB may include transparent polyimide (PI). A buffer layer BFL may be located on the substrate SUB, and may be an inorganic layer. A semiconductor pattern may be located on the buffer layer BFL. The semiconductor pattern may include polysilicon. However, the present disclosure is not limited thereto, and the semiconductor pattern may include amorphous silicon or metal oxide.

The semiconductor pattern may be doped with an N-type dopant or a P-type dopant. The semiconductor pattern may include a high doping area and a low doping area. The conductivity of the high doping area is greater than that of the low doping area, and may substantially serve as a source electrode and a drain electrode of the transistor TR. The low doping area may substantially correspond to the active (or channel) of the transistor.

The source S, active region A, and drain D of the transistor TR may be formed from a semiconductor pattern. The first insulating layer INS1 may be located on the semiconductor pattern. A gate G of the transistor TR may be located on the first insulating layer INS1. A second insulating layer INS2 may be located on the gate G. A third insulating layer INS3 may be located on the second insulating layer INS2.

The connection electrode CNE is located between the transistor TR and the light emitting element OLED to connect the transistor TR and the light emitting element OLED. The connection electrode CNE may include a first connection electrode CNE1 and a second connection electrode CNE2.

The first connection electrode CNE1 may be located on the third insulating layer INS3, and may be connected to the drain D through the first contact hole CH1 defined in the first to third insulating layers INS1 to INS3. A fourth insulating layer INS4 may be located on the first connection electrode CNE1. A fifth insulating layer INS5 may be located on the fourth insulating layer INS4.

The second connection electrode CNE2 may be located on the fifth insulating layer INS5. The second connection electrode CNE2 may be connected to the first connection electrode CNE1 through the second contact hole CH2 defined in the fourth and fifth insulating layers INS4 and INS5. A sixth insulating layer INS6 may be located on the second connection electrode CNE2. The first to sixth insulating layers INS1 to INS6 may be inorganic or organic layers. A layer from the buffer layer BFL to the sixth insulating layer INS6 may be defined as a circuit element layer DP-CL.

The first electrode AE may be located on the sixth insulating layer INS6. The first electrode AE may be connected to the second connection electrode CNE2 through the third contact hole CH3 defined in the sixth insulating layer INS6. A pixel defining layer PDL, which exposes a portion (e.g., a predetermined portion) of the first electrode AE, may be located on the first electrode AE and the sixth insulating layer INS6. An opening part PX_OP for exposing a portion (e.g., a predetermined portion) of the first electrode AE may be defined in the pixel defining layer PDL.

The hole control layer HCL may be located on the first electrode AE and the pixel defining layer PDL. The hole control layer HCL may be commonly located in the emission area PA and the non-emission area NPA. The hole control layer HCL may include a hole transport layer and a hole injection layer.

The emission layer EML may be located on the hole control layer HCL. The emission layer EML may be located in an area corresponding to the opening part PX_OP. The emission layer EML may include an organic material and/or an inorganic material. The emission layer EML may generate any one of red, green, and blue light.

The infrared emission layer IR-EL may generate infrared rays. The infrared emission layer IR-EL may include an organic material for generating infrared rays.

The electron control layer ECL may be located on the emission layer EML and the hole control layer HCL. The electron control layer ECL may be commonly located in the emission area PA and the non-emission area NPA. The electron control layer ECL may include an electron transport layer and an electron injection layer.

The second electrode CE may be located on the electronic control layer ECL. The second electrode CE may be commonly located on the pixels PX. The layer on which the light emitting element OLED and the infrared light emitting element IRD are located may be defined as a display element layer DP-OLED.

The thin film sealing layer TFE may be located on a light emitting element OLED and an infrared light emitting element IRD. The thin film sealing layer TFE may be located on the second electrode CE to cover the pixel PX and the infrared pixel IR-PX. The thin film sealing layer TFE may include a first sealing layer EN1 located on the second electrode CE, a second sealing layer EN2 located on the first sealing layer EN1, and a third sealing layer EN3 located on the second sealing layer EN2.

The first and third sealing layers EN1 and EN3 each may be an inorganic layer, and the second sealing layer EN2 may be an organic layer. The first and third sealing layers EN1 and EN3 may protect the pixel PX from moisture/oxygen. The second sealing layer EN2 may protect the pixel PX from foreign substances such as dust particles.

A first voltage may be applied to the first electrode AE through the transistor TR, and a second voltage having a level lower than the first voltage may be applied to the second electrode CE. The holes and electrons injected into the emission layer EML and the infrared emission layer IR-EL, respectively, are combined to form excitons, and while the excitons transition to the ground state, a light emitting element OLED and an infrared light emitting element IRD may emit light.

As described above, the infrared ray IR generated by the infrared light emitting element IRD may be reflected from the object OBT (FIG. 8) and provided to the proximity sensor PSN. In some embodiments of the present disclosure, because infrared rays for use in the proximity sensor PSN are generated in the display panel DP, a separate light emitting module for generating infrared rays may not be required.

As a result, according to some embodiments of the present disclosure, because the fingerprint sensor, the proximity sensor, and the illuminance sensor are internalized in one sensor panel, the fingerprint sensor, the proximity sensor, and the illuminance sensor may not be manufactured as separate modules.

Figure 11:
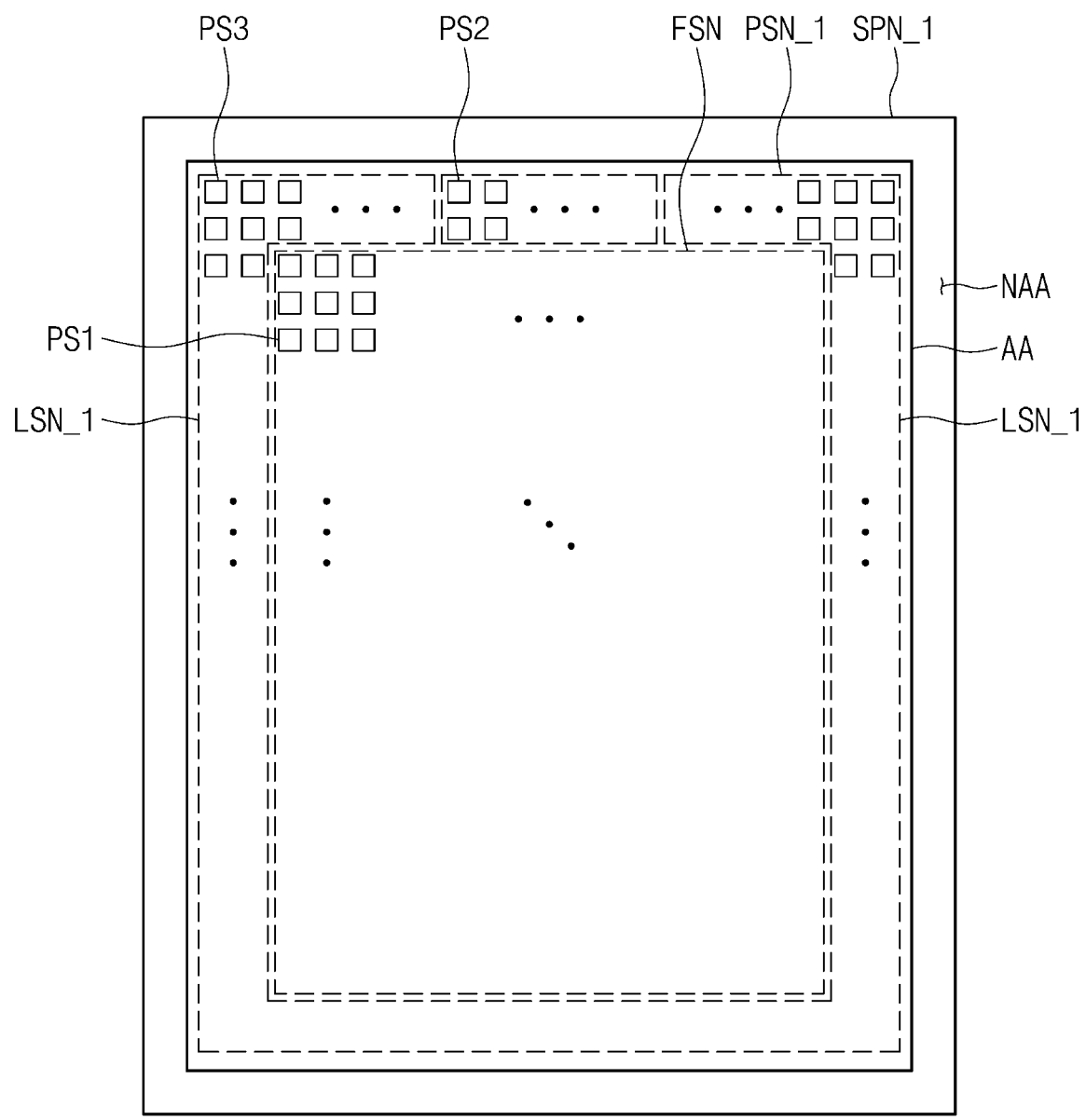
FIGS. 11 and 12 are views showing arrangement positions of a proximity sensor and an illuminance sensor according to various embodiments of the present disclosure.
Figure 11:
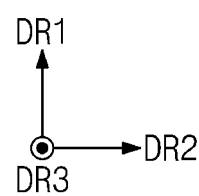
Figure 12:
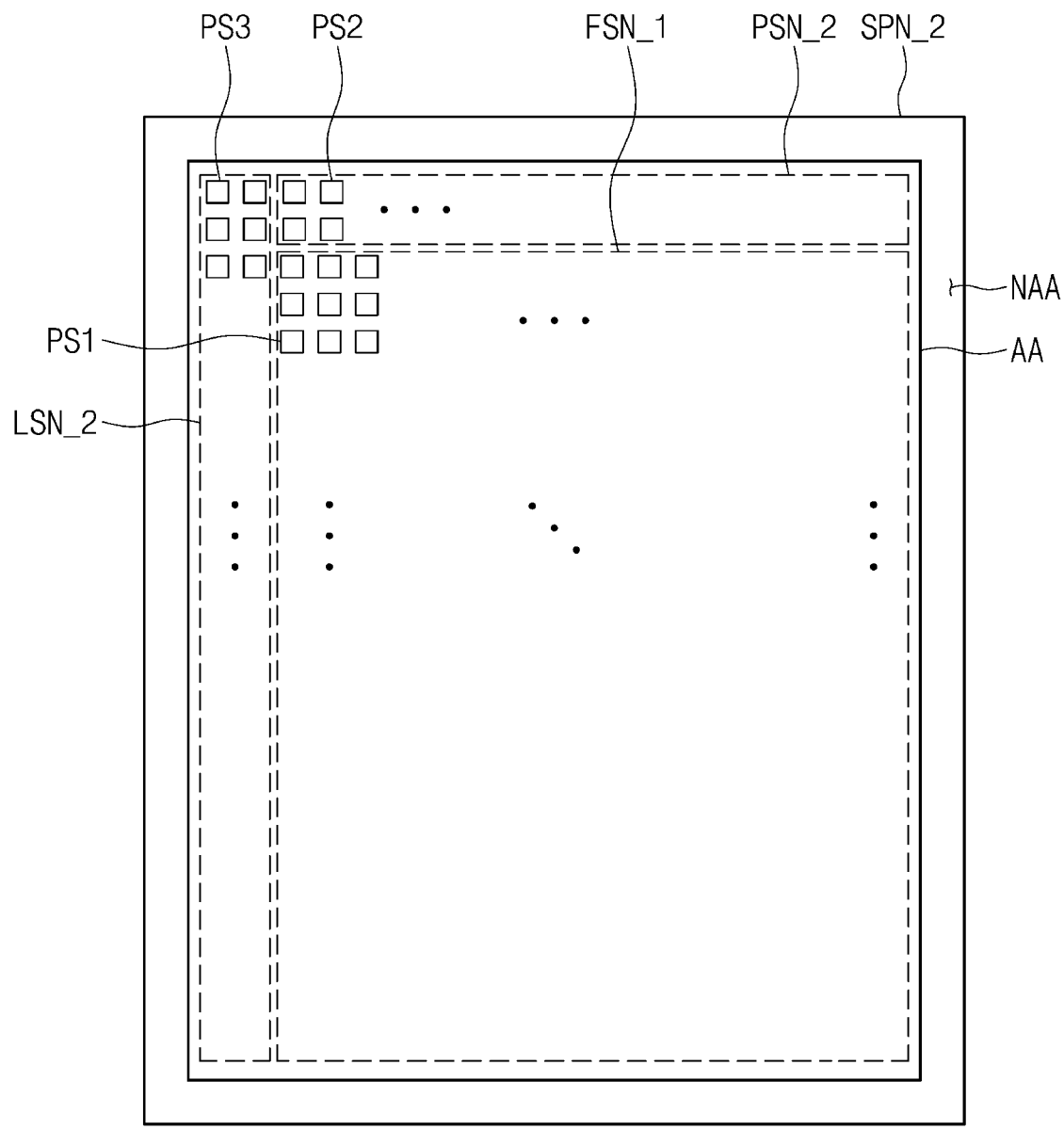

FIGS. 11 and 12 are views showing arrangement positions of a proximity sensor and an illuminance sensor according to various embodiments of the present disclosure.

For example, FIGS. 11 and 12 are illustrated in a plane corresponding to FIG. 6.

Referring to FIG. 11, an illuminance sensor LSN_1 and a proximity sensor PSN_1 may be located around a fingerprint sensor FSN. The illuminance sensor LSN_1 may be adjacent to the left and right sides of the sensor panel SPN_1 and the lower end of the sensor panel SPN_1 when viewed on a plane. In addition, the illuminance sensor LSN_1 may be located in a portion (e.g., a predetermined portion) of the sensor panel SPN_1 adjacent to the upper end of the sensor panel SPN_1 when viewed on a plane. The arrangement area of the illuminance sensor LSN_1 of FIG. 11 may be larger than the arrangement area of the illuminance sensor LSN shown in FIG. 6.

The proximity sensor PSN_1 may be located in a portion (e.g., a predetermined portion) of the sensor panel SPN_1 adjacent to the upper end of the sensor panel SPN_1. The proximity sensor PSN_1 may be located around the illuminance sensor LSN_1. The arrangement area of the proximity sensor PSN_1 of FIG. 11 may be smaller than the arrangement area of the proximity sensor PSN shown in FIG. 6.

Referring to FIG. 12, an illuminance sensor LSN_2 and a proximity sensor PSN_2 may be located around the fingerprint sensor FSN_1. The illuminance sensor LSN_2 may be adjacent to any one of the left and right sides of the sensor panel SPN_2 when viewed on a plane. For example, the illuminance sensor LSN_2 may be adjacent to the left side of the sensor panel SPN_2, but other embodiments are not limited thereto. For example, the illuminance sensor LSN_2 may be adjacent to the right side of the sensor panel SPN_2.

The proximity sensor PSN_2 may be located adjacent to the upper end of the sensor panel SPN_2 when viewed on a plane.

Figure 13:
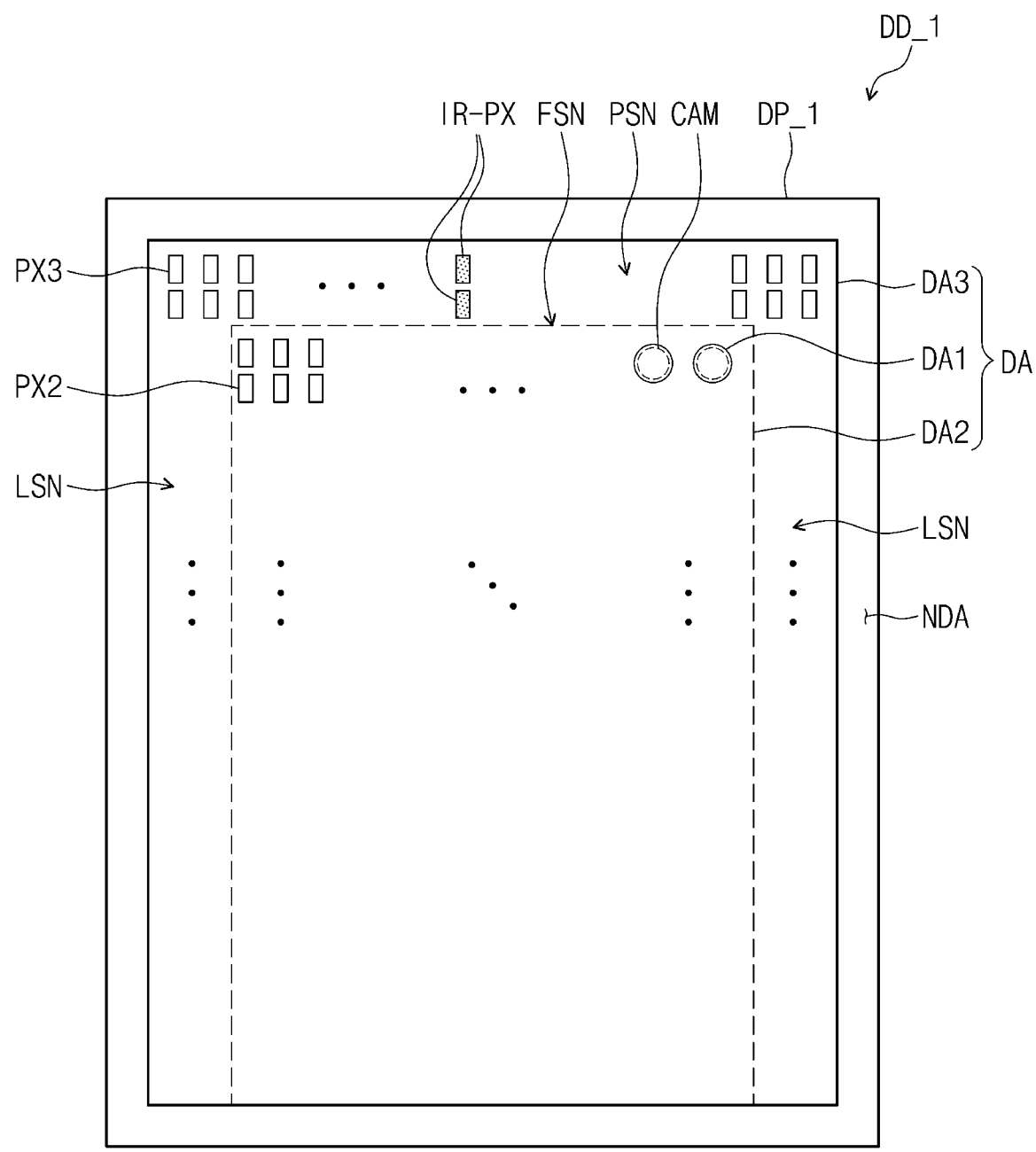
FIG. 13 is a diagram illustrating a configuration of a display panel of a display device according to other embodiments of the present disclosure.
Figure 14:
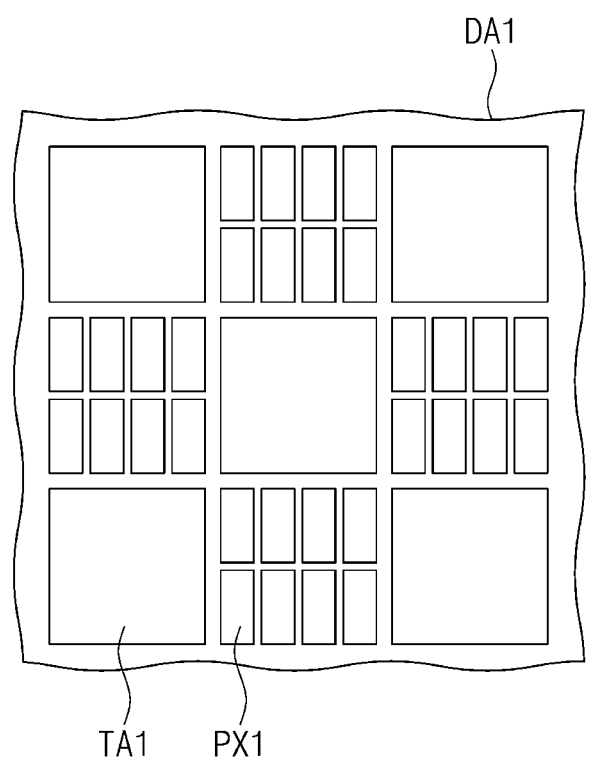
FIG. 14 is a diagram illustrating a part of the first display area shown in FIG. 13.

FIG. 13 is a diagram illustrating a configuration of a display panel of a display device according to other embodiments of the present disclosure, and FIG. 14 is a diagram illustrating a part of the first display area shown in FIG. 13.

Hereinafter, according to the need for explanation, the sensor panel shown in FIG. 6 will be described together.

Referring to FIGS. 6 and 13, when viewed on a plane, the display panel DP_1 may include a display area DA, and a non-display area NDA surrounding the display area DA. The non-display area NDA may surround the display area DA. The display area DA may include the first display areas DA1, the second display area DA2 around the first display areas DA1, and the third display area DA3 around the second display area DA2.

The second display area DA2 may surround the first display areas DA1. The third display area DA3 may be adjacent to the non-display area NDA. The third display area DA3 may be located between the second display area DA2 and the non-display area NDA.

Referring to FIGS. 13 and 14, a camera may be located under the first display areas DA1. Further, a plurality of first pixels PX1 may be located in the first display areas DA1. A plurality of first transmissive areas TA1 in which the first pixels PX1 are not located may be defined in the first display areas DA1. The first transmissive areas TA1 may be arranged in a first direction DR1 and a second direction DR2. The first pixels PX1 may be located around each of the first transmissive areas TA1. For example, the first pixels PX1 may be located between respective ones of the first transmissive areas TA1.

A plurality of second pixels PX2 may be located in the second display area DA2. The configuration of the second pixels PX2 may be substantially the same as the configuration of the first pixels PX1. A plurality of third pixels PX3 may be located in the third display area DA3. The configuration of the third pixels PX3 may be substantially the same as the configuration of the first pixels PX1. The first, second, and third pixels PX1, PX2, and PX3 may include the above-mentioned red, green, and blue pixels.

When viewed on a plane, a portion of the third display area DA3 adjacent to the upper end of the display panel DP may overlap the proximity sensor PSN. At least one infrared pixel IR-PX may be located in a portion of the third display area DA3 adjacent to the upper end of the display panel DP to overlap the proximity sensor PSN. When viewed on a plane, a portion of the third display area DA3 adjacent to the left and right sides of the display panel DP may overlap the illuminance sensor LSN. When viewed on a plane, the second display area DA2 may overlap the fingerprint sensor FSN.

Figure 15:
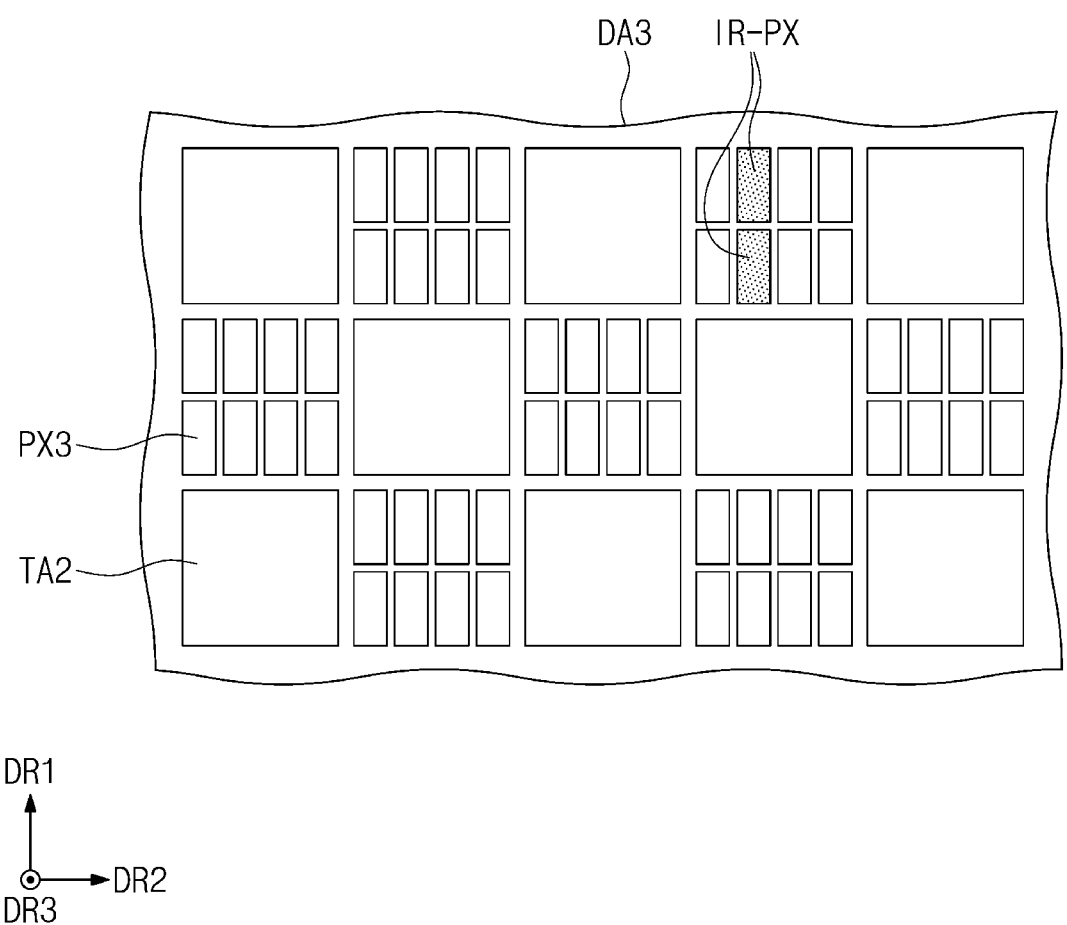
FIG. 15 is a diagram illustrating a part of the third display area shown in FIG. 13.

FIG. 15 is a diagram illustrating a part of the third display area shown in FIG. 13.

Referring to FIG. 15, a plurality of third pixels PX3 and at least one infrared pixel IR-PX may be located in the third display area DA3. A plurality of second transmissive areas TA2 in which the third pixels PX3 are not located may be defined in the third display area DA3. The second transmissive areas TA2 may be arranged in a first direction DR1 and a second direction DR2. The third pixels PX3 and/or the at least one infrared pixel IR-PX may be located between respective ones of the second transmissive areas TA2.

For example, in FIG. 15, a portion of the third display area DA3 overlapping the proximity sensor PSN is illustrated. In some embodiments, a portion of the third display area DA3 overlapping the illuminance sensor LSN may also have the same configuration as that illustrated in FIG. 15.

Figure 16:
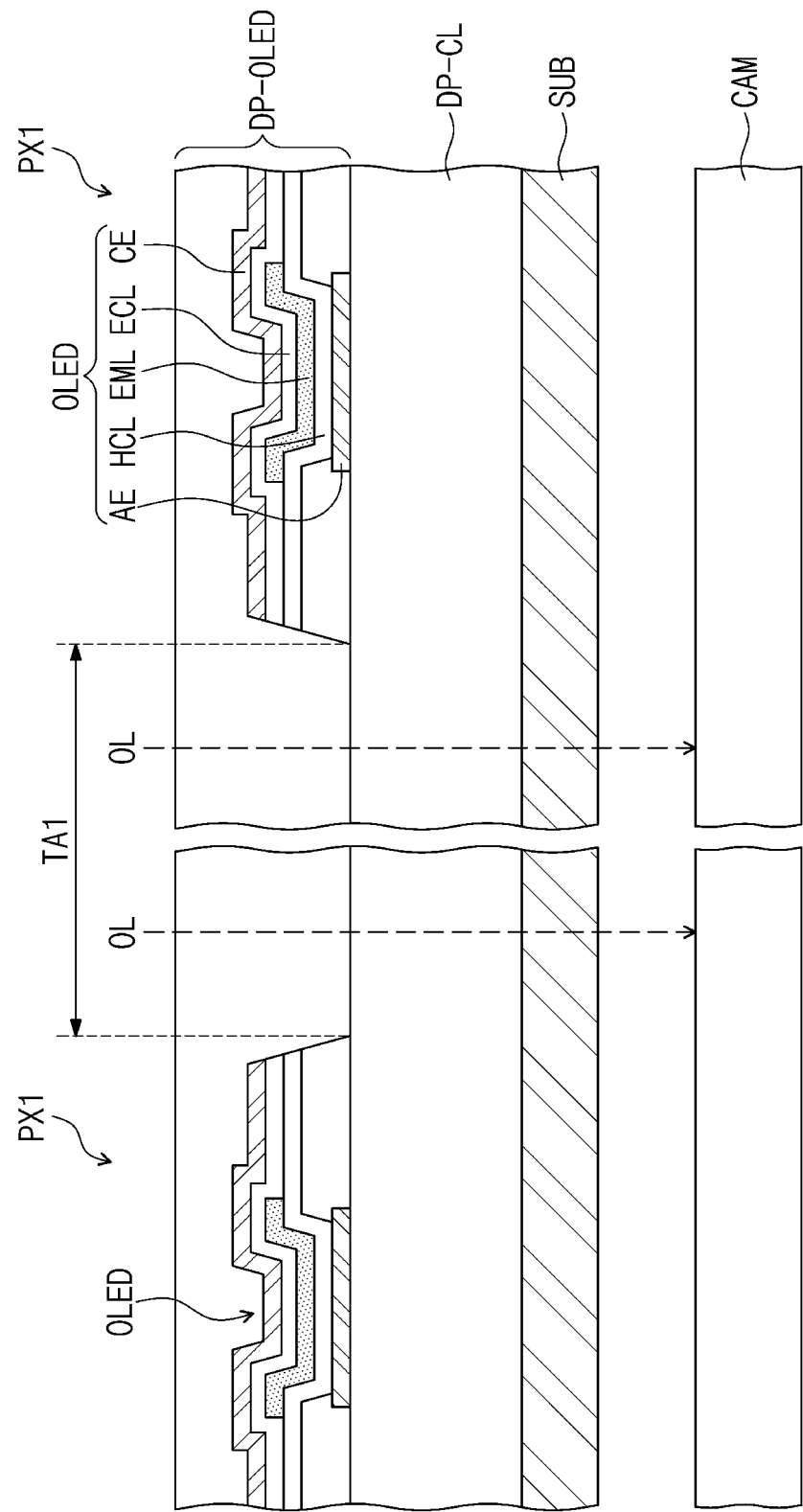
FIG. 16 is a diagram illustrating cross-sections of one transmissive area and first pixels adjacent to the transmissive area illustrated in FIG. 14.
Figure 17:
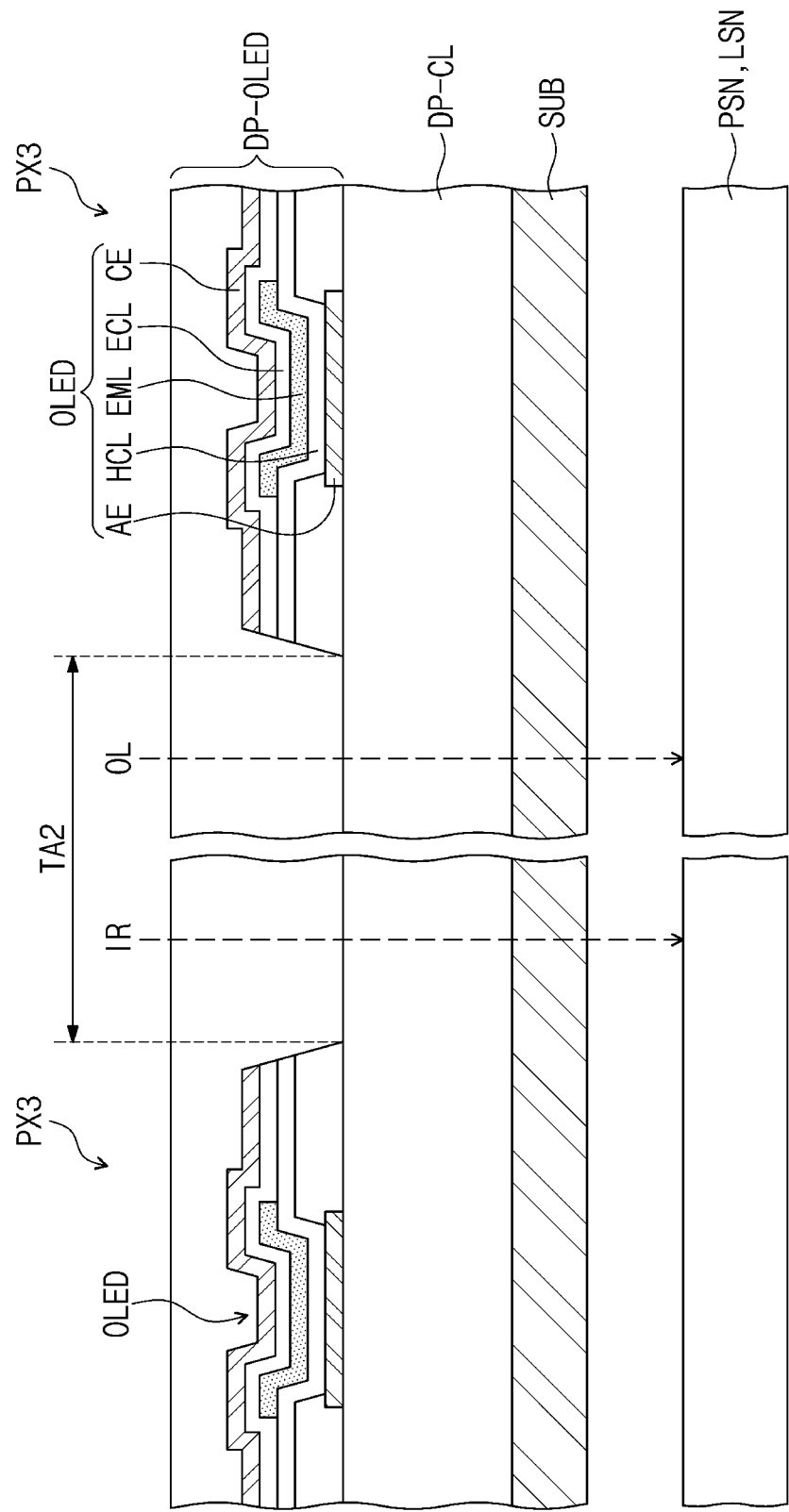
FIG. 17 is a diagram illustrating cross-sections of one transmissive area and third pixels adjacent to the transmissive area illustrated in FIG. 15.

FIG. 16 is a diagram illustrating cross-sections of one transmissive area, and first pixels adjacent to the transmissive area illustrated in FIG. 14, and FIG. 17 is a diagram illustrating cross-sections of one transmissive area, and third pixels adjacent to the transmissive area illustrated in FIG. 15.

Illustratively, in FIGS. 16 and 17, the circuit element layer DP-CL is shown as a single layer.

Referring to FIG. 16, a camera CAM may be located under the first display area DA1. The cross-sectional structure of the first pixels PX1 may be substantially the same as the cross-sectional structure of the pixel PX illustrated in FIG. 10.

The light emitting element OLED might not be located in the first transmissive area TA1. An image (e.g., a predetermined image) may be displayed by the first pixels PX1. In addition, the camera CAM may receive external light OL through the first transmissive area TA1 to capture an external image.

Referring to FIG. 17, a proximity sensor PSN or an illuminance sensor LSN may be located under the third display area DA3. The cross-sectional structure of the third pixels PX3 may be substantially the same as the cross-sectional structure of the pixel PX illustrated in FIG. 10.

The light emitting element OLED might not be located in the second transmissive area TA2. An image (e.g., a predetermined image) may be displayed by the third pixels PX3. In addition, the proximity sensor PSN or the illuminance sensor LSN may receive infrared IR or external light OL through the second transmissive area TA1. Because the light emitting element OLED is not located in the second transmissive area TA2, the amount of light provided to the proximity sensor PSN or the illuminance sensor LSN may be increased.

According to some embodiments of the present disclosure, the fingerprint sensor, the proximity sensor, and the illuminance sensor are not manufactured as separate modules, and may be internalized in one sensor panel.

Although the embodiments of the present disclosure have been described, it is understood that the present disclosure should not be limited to these embodiments but various changes and modifications can be made by one ordinary skilled in the art within the spirit and scope of the present disclosure as hereinafter claimed, with functional equivalents of the claims to be included therein.

What is claimed is:

1. A display device comprising:
    a display panel comprising a display area comprising red pixels, green pixels, blue pixels, and infrared light emitting elements arranged along with the green pixels in a second direction crossing a first direction; and
    a sensor panel under the display panel, and comprising:
        a fingerprint sensor;
        a proximity sensor between the fingerprint sensor and a first edge of the sensor panel in a plan view; and
        an illuminance sensor between the fingerprint sensor and a second edge of the sensor panel in a plan view, and adjacent to the proximity sensor,
    wherein the second edge extends in the first direction and the first edge extends is the second direction,
    wherein each of the infrared light emitting elements has a smaller size than a light emitting element of each of the red pixels in a plan view,
    wherein each of the infrared light emitting elements has a same size as a light emitting element of each of the green pixels in a plan view, and
    wherein each of the infrared light emitting elements has a smaller size than a light emitting element of each of the blue pixels in a plan view.

2. The display device of claim 1, wherein each of the fingerprint sensor, the proximity sensor, and the illuminance sensor comprises at least one photo sensor.

3. The display device of claim 1, wherein the proximity sensor and the illuminance sensor are respectively adjacent to the first and second edges of the sensor panel.

4. The display device of claim 1, wherein the display panel further comprises a non-display area around the display area.

5. The display device of claim 4, wherein the fingerprint sensor, the proximity sensor, and the illuminance sensor are overlapped by the display area in a plan view.

6. The display device of claim 4, wherein the infrared light emitting elements overlap the proximity sensor in a plan view.

7. The display device of claim 4, wherein the infrared light emitting elements are adjacent to the non-display area.

8. The display device of claim 4, wherein the infrared light emitting elements being consecutively arranged between the two adjacent ones of the green pixels,
    wherein each of the infrared light emitting elements is disposed between light emitting elements of two red pixels facing each other in a first diagonal direction crossing the first and second directions and between light emitting elements of two blue pixels facing each other in a second diagonal direction crossing the first diagonal direction, and
    wherein the light emitting element of each of the red, green, and blue pixels and each of the infrared light emitting elements are defined by an opening part of a pixel defining layer.

9. The display device of claim 1, further comprising an infrared cut filter between the display panel and the sensor panel, and overlapping the fingerprint sensor in a plan view.

10. The display device of claim 9, wherein the infrared cut filter does not overlap the illuminance sensor in a plan view.

11. The display device of claim 9, wherein the infrared cut filter does not overlap the proximity sensor in a plan view.

12. The display device of claim 1, wherein the proximity sensor is adjacent to an upper end of the sensor panel in a plan view.

13. The display device of claim 12, wherein the illuminance sensor is adjacent to left and right sides of the sensor panel in a plan view.

14. The display device of claim 12, wherein the illuminance sensor is adjacent to a lower end and left and right sides of the sensor panel in a plan view.

15. The display device of claim 12, wherein the illuminance sensor is adjacent to one of left and right sides of the sensor panel in a plan view.

16. The display device of claim 1, wherein the display panel comprises:
a first display area comprising a first transmissive area, and a first pixel adjacent the first transmissive area;
a second display area around the first display area, overlapping the fingerprint sensor, and comprising a second pixel; and
a third display area around the second display area, and comprising a second transmissive area, and a third pixel adjacent the second transmissive area.

17. The display device of claim 16, wherein the third display area overlaps the illuminance sensor in a plan view.

18. The display device of claim 16, wherein the third display area overlaps the proximity sensor in a plan view.

19. A display device comprising:
a display panel comprising a display area comprising multiple red pixels, green pixels, blue pixels, and infrared light emitting elements arranged along with the green pixels in a second direction crossing a first direction;
a sensor panel under the display panel; and
an infrared cut filter between the display panel and the sensor panel, and wherein the sensor panel comprises:
a fingerprint sensor;
a proximity sensor between the fingerprint sensor and a first edge of the sensor pane in a plan view; and
an illuminance sensor between the fingerprint sensor and a second edge of the sensor panel in a plan view, the illuminance sensor being adjacent to the proximity sensor,
wherein the infrared cut filter overlaps the fingerprint sensor, and does not overlap the illuminance sensor or the proximity sensor, in a plan view,
wherein the second edge extends in the first direction,
wherein the first edge extends in the second direction,
wherein each of the infrared light emitting elements has a smaller size than a light emitting element of each of the red pixels in a plan view,
wherein each of the infrared light emitting elements has a same size as a light emitting element of each of the green pixels in a plan view, and
wherein each of the infrared light emitting elements has a smaller size than a light emitting element of each of the blue pixels in a plan view.

20. A display device comprising:
a display panel;
a sensor panel under the display panel; and
an infrared cut filter between the display panel and the sensor panel, and
wherein the sensor panel comprises:
a fingerprint sensor;
a proximity sensor between the fingerprint sensor and a first edge of the sensor pane in a plan view; and
an illuminance sensor between the fingerprint sensor and a second edge of the sensor panel in a plan view, the illuminance sensor being adjacent to the proximity sensor,
wherein the infrared cut filter overlaps the fingerprint sensor, and does not overlap the illuminance sensor or the proximity sensor, in a plan view,
wherein the second edge extends a first direction, and
wherein the first edge extends a second direction crossing the first direction,
wherein the display panel comprises:
at least one pixel; and
an infrared light emitting element,
wherein the at least one pixel comprises:
a red pixel;
a green pixel; and
a blue pixel, and
wherein the infrared light emitting element having a same size as a light emitting element of the green pixel in a plan view, and having a smaller size than a light emitting element of the red pixel in a plan view or having a smaller size than a light emitting element of the blue pixel in a plan view.

\* \* \* \* \*